US009141743B1

(12) United States Patent
McCracken et al.

(10) Patent No.: US 9,141,743 B1
(45) Date of Patent: Sep. 22, 2015

(54) METHODS, SYSTEMS, AND ARTICLES OF MANUFACTURE FOR PROVIDING EVOLVING INFORMATION IN GENERATING A PHYSICAL DESIGN WITH CUSTOM CONNECTIVITY USING FORCE MODELS AND DESIGN SPACE DECOMPOSITION

(71) Applicant: Candence Design Systems, Inc., San Jose, CA (US)

(72) Inventors: Thaddeus C. McCracken, Portland, OR (US); Joseph P. Jarosz, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/842,791

(22) Filed: Mar. 15, 2013

(51) Int. Cl.
*G06F 17/50* (2006.01)
(52) U.S. Cl.
CPC .................. *G06F 17/5068* (2013.01)
(58) Field of Classification Search
CPC ................. G06F 17/50; G06F 15/04
USPC ........................................ 716/132
See application file for complete search history.

(56) References Cited

U.S. PATENT DOCUMENTS

| | | | |
|---|---|---|---|
| 5,910,897 A | 6/1999 | Dangelo et al. | |
| 6,026,223 A | 2/2000 | Scepanovic et al. | |
| 7,469,143 B2 | 12/2008 | Jain et al. | |
| 8,046,313 B2 * | 10/2011 | Hoffberg et al. | 706/14 |
| 8,587,102 B2 * | 11/2013 | Leedy | 257/678 |
| 2003/0079192 A1 | 4/2003 | Cheong et al. | |
| 2004/0230931 A1 | 11/2004 | Barbee et al. | |
| 2007/0147269 A1 | 6/2007 | Ettle et al. | |
| 2007/0294648 A1 | 12/2007 | Allen et al. | |
| 2008/0216040 A1 | 9/2008 | Furnish et al. | |
| 2009/0031265 A1 | 1/2009 | Papadopoulou et al. | |
| 2009/0254874 A1 | 10/2009 | Bose | |
| 2013/0283225 A1 | 10/2013 | Alpert et al. | |

OTHER PUBLICATIONS

"Geometric Algorithms" URL: http://www.cs.princeton.edu/~rs/AlgsDS07/16Geometric.pdf, 2007.
"Voronoi Diagram" URL: http://mathworld.wolfram.com/VoronoiDiagram.html, 1999.
Adya, Saurabh N., and Igor L. Markov. "Fixed-outline floorplanning: Enabling hierarchical design." Very Large Scale Integration (VLSI) Systems, IEEE Transactions on 11.6 (2003): 1120-1135.
Arya et al., "Linear-Size Approximate Voronoi Diagrams" 2002.
Arya, Sunil, Theocharis Malamatos, and David M. Mount. "Space-efficient approximate Voronoi diagrams." Proceedings of the thiry-fourth annual ACM symposium on Theory of computing. ACM, 2002.

(Continued)

*Primary Examiner* — Thuan Do
(74) *Attorney, Agent, or Firm* — Vista IP Law Group, LLP

(57) ABSTRACT

Disclosed are methods, systems, and articles of manufactures for providing evolving information in generating a physical design with custom conductivity using force models and design space decomposition by first presenting a layout area in an interface. The interface then displays the evolution of the physical design in the interface to reflect temporal states of the physical design during generation of the physical design after the system receives an input for the physical design and a request for creating the physical design.

23 Claims, 33 Drawing Sheets

---

402 UI Menu Items

404 Control Panel
- Force Model Controls
- Decomposition Engine Controls
- Design Controls
- Design Generation Process Controls
  - Design Requirement(s)
  - Display Control 406 Design Display Area
- In-situ Display to Modifications of Design or Engine(s)
- Animated Display of Physical Design Evolution in Normal or Reverse Order
- Sequential Display of Physical Design Evolution
- Context-Based Display of Design Related Information 410 Pop-Up Display Area(s)

408 Design Details Display Area
- Hint(s) / Suggestion(s) / Help
- Assisted Fix(es) / Option(s) or
- Automated Fix(es) / Option(s)
- Details of Design Related Information 412 UI for Identification of Design Element(s)

(56) References Cited

OTHER PUBLICATIONS

Auber, D., et al. "Animated, Dynamic Voronoi Treemaps." 2010.
Balzer, Michael, Oliver Deussen, and Claus Lewerentz. "Voronoi treemaps for the visualization of software metrics." Proceedings of the 2005 ACM symposium on Software visualization. ACM, 2005.
Chen, Tung-Chieh, et al. "MP-trees: a packing-based macro placement algorithm for mixed-size designs." Design Automation Conference, 2007. DAC'07. 44th ACM/IEEE. IEEE, 2007.
Chen, Tung-Chieh, et al. "MP-trees: A packing-based macro placement algorithm for modern mixed-size designs." Computer-Aided Design of Integrated Circuits and Systems, IEEE Transactions on 27.9 (2008): 1621-1634.
Choi, S-G., and Chong-Min Kyung. "A floorplanning algorithm using rectangular Voronoi diagram and force-directed block shaping." Computer-Aided Design, 1991. ICCAD-91. Digest of Technical Papers., 1991 IEEE International Conference on. IEEE, 1991.
David Austin, "Voronoi Diagrams and a Day at the Beach", URL: http://www.ams.org/samplings/feature-column/fcarc-voronoi, Aug. 2006.
Non-Final Office Action dated Mar. 17, 2014 for U.S. Appl. No. 13/842,684.
Non-Final Office Action dated May 9, 2014 for U.S. Appl. No. 13/843,706.
Final Office Action dated Apr. 22, 2014 for U.S. Appl. No. 13/843,706.
Non-Final Office Action dated Dec. 10, 2013 for U.S. Appl. No. 13/843,706.
Fatemeh Ahmadi Nejad Masouleh, "Constructing Weighted Voronoi Diagrams Using Computer Programs", URL: http://giswin.geo.tsukuba.ac.jp/sis/tutorial/GISHint,fatemeh.pdf, Dec. 2006.

Fruchterman, Thomas MJ, and Edward M. Reingold. "Graph drawing by force-directed placement." Software: Practice and experience 21.11 (1991): 1129-1164.
Guilherme Fonseca, "Approximate Voronoi Diagrams" Mar. 2005.
Guo, Pei-Ning, Chung-Kuan Cheng, and Takeshi Yoshimura. "An O-tree representation of non-slicing floorplan and its applications." Proceedings of the 36th annual ACM/IEEE Design Automation Conference. ACM, 1999.
Hu, Yifan. "Efficient, high-quality force-directed graph drawing." Mathematica Journal 10.1 (2005): 37-71.
Ogniewicz, R., and M. Ilg. "Voronoi skeletons: Theory and applications." Computer Vision and Pattern Recognition, 1992. Proceedings CVPR'92., 1992 IEEE Computer Society Conference on. IEEE, 1992.
Sang-Gil Choi and Chong-Min Kyung "A Floorplanning Algorithm Using Rectangular Voronoi Diagram and Force-Directed Block Shaping", Department of Electrical Engineering, Korea Advanced Institute of Science and Technology, 1991 IEEE.
Schneider, Jens, Martin Kraus, and Rüdiger Westermann. "GPU-based Real-time Discrete Euclidean Distance Transforms with Precise Error Bounds." VISAPP (1). 2009.
Sud, Avneesh, Danyel Fisher, and Huai-Ping Lee. "Fast dynamic voronoi treemaps." Voronoi Diagrams in Science and Engineering (ISVD), 2010 International Symposium on. IEEE, 2010.
T. Ventimiglia et al., "The Barnes-Hut Algorithm" URL: arborjs.org/docs/barnes-hut, 2003.
Vorwerk, Kristofer, Andrew Kennings, and Anthony Vannelli. "Engineering details of a stable force-directed placer." *Proceedings of the 2004 IEEE/ACM International conference on Computer-aided design*. IEEE Computer Society, 2004.
Notice of Allowance dated Jan. 22, 2015 for U.S. Appl. No. 13/843,706.
Notice of Allowance dated Jan. 22, 2015 for U.S. Appl. No. 13/842,684.

* cited by examiner

| 402 UI Menu Items |
|---|

| 404 Control Panel<br><br>- Force Model Controls<br>- Decomposition Engine Controls<br>- Design Controls<br>- Design Generation Process Controls<br>  - Design Requirement(s)<br>  - Display Control | 406 Design Display Area<br><br>- In-situ Display to Modifications of Design or Engine(s)<br>- Animated Display of Physical Design Evolution in Normal or Reverse Order<br>- Sequential Display of Physical Design Evolution<br>- Context-Based Display of Design Related Information |
|---|---|
| 410 Pop-Up Display Area(s) | |

| 408 Design Details Display Area<br>- Hint(s) / Suggestion(s) / Help<br>- Assisted Fix(es) / Option(s) or<br>- Automated Fix(es) / Option(s)<br>- Details of Design Related Information |
|---|

| 412 UI for Identification of Design Element(s) |
|---|

METHODS, SYSTEMS, AND ARTICLES OF MANUFACTURE FOR PROVIDING EVOLVING INFORMATION IN GENERATING A PHYSICAL DESIGN WITH CUSTOM CONNECTIVITY USING FORCE MODELS AND DESIGN SPACE DECOMPOSITION

CROSS REFERENCE TO RELATED APPLICATION(S)

This application is related to U.S. patent application Ser. No. 13/842,890 entitled "METHODS, SYSTEMS, AND ARTICLES OF MANUFACTURE FOR IMPLEMENTING PHYSICAL DESIGN USING FORCE MODELS", and U.S. patent application Ser. No. 13/843,706 Entitled "METHODS, SYSTEMS, AND ARTICLES OF MANUFACTURE FOR IMPLEMENTING PHYSICAL DESIGN DECOMPOSITION WITH CUSTOM CONDUCTIVITY", and U.S. patent application Ser. No. 13/842,684 entitled "METHODS, SYSTEMS, AND ARTICLES OF MANUFACTURE FOR IMPLEMENTING PHYSICAL DESIGNS WITH FORCE PLACEMENT OR FLOORPLANNING AND LAYOUT DECOMPOSITION", the content of the three applications is hereby incorporated by reference in its entirety for all purposes.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

A modern IC design, an IP (intellectual property) cell in the IC (integrated circuit) core area may communicate and exchange data with certain IP cells in the IC core area and certain part(s) in the outer I/O (input/output) ring and thus need to stay within some close proximity of the corresponding portion in the I/O ring. During the early design planning stages where design data are scarce and incomplete at best, an architect may have to determine what the fabric need to look like in order to meet various criteria, such as functional requirements, I/O conductivity or connectivity, fabric configuration, etc. Modern electronic designs (e.g., SOCs (system on chip)) or include functional IPs (intellectual property) such as interface cores, CPUs (central processing units), encorder, decoder, memory interfaces, etc. that may need to interconnected in some fashion so as to move data among these functional IPs. A fabric includes such interconnections of such electronic design together with other components such as arbiters to resolve contention for a resource, queues, etc.

Moreover, some of the design criteria may compete with some other design criteria, and the conflicting criteria may further exacerbate the challenges. Traditional approaches typically receive, for example, the functional requirements for a design, model the design in terms of the flow of the signals and the logic operations on these signals in RTL (register transfer level), synthesize the RTL, and perform prototyping using the netlist from the synthesis. Nonetheless, such conventional approaches may not properly serve prototyping, IO planning, feasibility analysis, or floorplanning in early design stages where the details of the design are lacking or to be determined. Therefore, what is needed is a method, system, and computer program product for implementing physical design decomposition with custom connectivity.

SUMMARY

Disclosed are methods, systems, and articles of manufactures for providing evolving information in generating a physical design with custom conductivity or connectivity using force models and design space decomposition by first presenting a layout area in an interface. The interface then displays the evolution of the physical design to reflect temporal states of the physical design during generation of the physical design after the system receives an input for the physical design and a request for creating the physical design. The user interface such as a graphical user interface that provides continuous, incremental, nearly real-time feedback to a designer or architect that the designer or architect may observe how the design planning (e.g., IO planning or floorplanning) is morphing into the final form while maintaining the imposed requirements, constraints, or rules. The user interface may further provide the capability to a designer or architect to manipulate various aspects of the design such as the constraints, the physical aspects of the design, the partitioning, etc. Various features of the user interface will be described in greater details in the application.

Some embodiments identify custom, incomplete conductivity for an electronic design from, for example, some user specified conductivity that requires some portion of the electronic design to communicate or exchange data with another portion of the electronic design. These embodiments may then partition a physical design space of the electronic design into a plurality of cells that are, by their nature, non-overlapping and iteratively move at least some of the nodes of the plurality of cells until one or more convergence criteria are satisfied while maintaining the custom, incomplete conductivity through the entire partitioning process.

These embodiments generate a floorplan or a placement layout that resembles the final floorplan obtained through the complete floorplanning process or the final placement layout through the complete placement process without requiring or assuming that complete conductivity information is provided to the floorplanner or placement tool. Moreover, although the floorplan or placement layout is generated with some incomplete connectivity by various embodiments described herein, the generated floorplan and placement is nonetheless realizable to meet both functional and performance goals by at least using the connectivity information during the generation process for the floorplan or the placement layout as well by using one or more force models to decompose a physical design space in a particular manner to serve the functional and performance goals. In some embodiments, various processes described herein generate the floorplan or placement layout, which resembles the final floorplan obtained through the complete floorplanning process or the final placement layout through the placement process, without requiring any detailed information about a block or cell to be used in an electronic design. For example, various embodiments do not need to have any information of the input(s), output(s), pin(s), terminal(s), pad(s), etc. of an IP block or cell to be used in an electronic design in order to generate a credible, realistic floorplan or placement layout that resembles the final floorplan or placement layout. In some embodiments, various processes described herein generate the floorplan or placement layout, which resembles the final floorplan obtained through the complete floorplanning process or the final placement layout through the placement process, without requiring a complete netlist.

In some embodiments, various processes described herein generate the floorplan or placement layout, which resembles the final floorplan obtained through the complete floorplanning process or the final placement layout through the placement process, without any netlist at all because these described processes may generate such a credible floorplan or placement to resemble the final floorplan or placement layout based at least in part on the conductivity information. It shall be noted that the terms conductivity and connectivity are used interchangeably, unless otherwise specifically recited. In addition, the conductivity or connectivity used in various embodiments may be incomplete and merely specifies one portion of a design is to communicate or exchange data with another portion of the design without specifying how these two portions are connected. In some embodiments, various processes described herein generate the floorplan or placement layout, which resembles the final floorplan obtained through the complete floorplanning process or the final placement layout through the placement process, without performing the synthesis process on, for example, the RTL (register transfer level) level design.

Various embodiments implement a physical design by using multiple force models, which include one or more attractive force models, one or more repulsive models, or combinations thereof, to iteratively morph a layout decomposition that includes a plurality of cells by using the force models to move at least some nodes of the plurality of cells and then to re-partition the design based at least in part on these nodes that have been moved to new locations by the force models. In addition to attractive force model(s) or repulsive force model(s), some embodiments also use a containment force model for grouping multiple design blocks or cells or for confining a node of a cell within the boundary of a container.

Some embodiments are directed at deriving a first force model at the first hierarchical level from a second force model at the second hierarchical level by directly modifying the second model based at least in part on one or more characteristics of the first hierarchical level and the corresponding one or more characteristics of the second hierarchical level. In a design with multiple hierarchies, some embodiments may use a cell-based force model to ensure that the child nodes of a parent cell stay close to the parent node of the parent cell. Some embodiments use the force models to operate on a set of cells representing decomposition of a layout area so as to determine a placement layout or a floorplan while maintaining custom, incomplete conductivity information. Various embodiments described herein use force models and decomposition engine(s) and do not require that complete conductivity information be provided in order to generate a placement layout or floorplan, which resembles a final placement layout or a final floorplan, for quick feasibility studies or quick prototyping, without using conventional placement tool or floorplanner.

Some embodiments employ the use of a force model, which models the interaction between two features in a design by using both the attraction and repulsion forces. The force model enables the designer or the architect to observer the results of floorplanning or IO (input/output) planning in early stages of the electronic design while maintaining specific connectivity requirement(s). A typical example of a specific connectivity requirement is user specified connectivity between a circuit feature (e.g., a cell) in the IC core area and another circuit feature (e.g., a pin or an IO cell) in the ring area of the IC design.

The force model may incrementally calculate the attractive forces and/or repulsive forces for each circuit feature (e.g., a cell or a node) that are interconnected with another circuit feature, determines the resultant force for the circuit feature, and then moves the circuit feature according to the resultant force. The force model then iteratively recalculates the resultant force for each circuit feature until a convergence criterion is met. An example of such a convergence criterion is when the variation of a specific energy (e.g., potential energy) of the electronic design is smaller than or equal to a predetermined threshold value. The force model may constrain the move of each circuit feature by using a container that limits the range in which the circuit feature may be moved in some embodiments. The boundary of a core cell, a pin, an IO cell, or any elements of a physical hierarchy may serve as a container for the cell or the pin under consideration for the determination of the attractive and repulsive forces for the cell or pin.

In some embodiments, the repulsive force may be modeled as electrical repulsive force between the two circuit features, both of which may be modeled as electrical charges of the same polarity. In some embodiments, the repulsion may be modeled as the restoring force of a spring connecting both circuit features. In some embodiments, the attractive force may be modeled as a spring force model connecting these two circuit features or a gravitational pull between these two circuit features whose "weights" are proportional to their respective areas. The force model may work with any decomposition or partitioning schemes and may model various forms of requirements or constraints in terms of attractive and/or repulsive forces such that all the required or desired requirements, including conflicting requirements, may be accommodated during the early stages of the electronic design.

Some embodiments are directed at a hardware system that may be invoked to perform any of the methods, processes, or sub-processes disclosed herein. The hardware system may include at least one processor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Overview section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Overview section below.

BRIEF DESCRIPTION OF THE FIGURES

The drawings illustrate the design and utility of various embodiments. It should be noted that the figures are not drawn to scale and that elements of similar structures or functions are represented by like reference numerals throughout the figures. In order to better appreciate how to obtain the above-recited and other advantages and objects of various embodiments, a more detailed description of the inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIG. 4 illustrates a schematic representation of a user interface for providing evolving information in generating a physical design with custom conductivity using force models and design space decomposition in some embodiments.

DETAILED DESCRIPTION OF ILLUSTRATED EMBODIMENTS

Various embodiments are directed to a method, system, and computer program product for implementing and using virtual sales process engineering. Other objects, features, and advantages of the invention are described in the detailed description, figures, and claims.

Various embodiments of the methods, systems, and articles of manufacture will now be described in detail with reference to the drawings, which are provided as illustrative examples of the invention so as to enable those skilled in the art to practice the invention. Notably, the figures and the examples below are not meant to limit the scope of various embodiments, unless otherwise specifically described in particular embodiment(s) or recited in the claim(s). Where certain elements of embodiments may be partially or fully implemented using known components (or methods or processes), portions of such known components (or methods or processes) that are necessary for an understanding of the present invention will be described, and the detailed descriptions of other portions of such known components (or methods or processes) will be omitted for ease of explanation and to not obscure embodiments of the invention. Further, embodiments encompass present and future known equivalents to the components referred to herein by way of illustration. More details about various processes or modules to implement various embodiments are further described below with reference to FIGS. 1-15.

Figure 1:
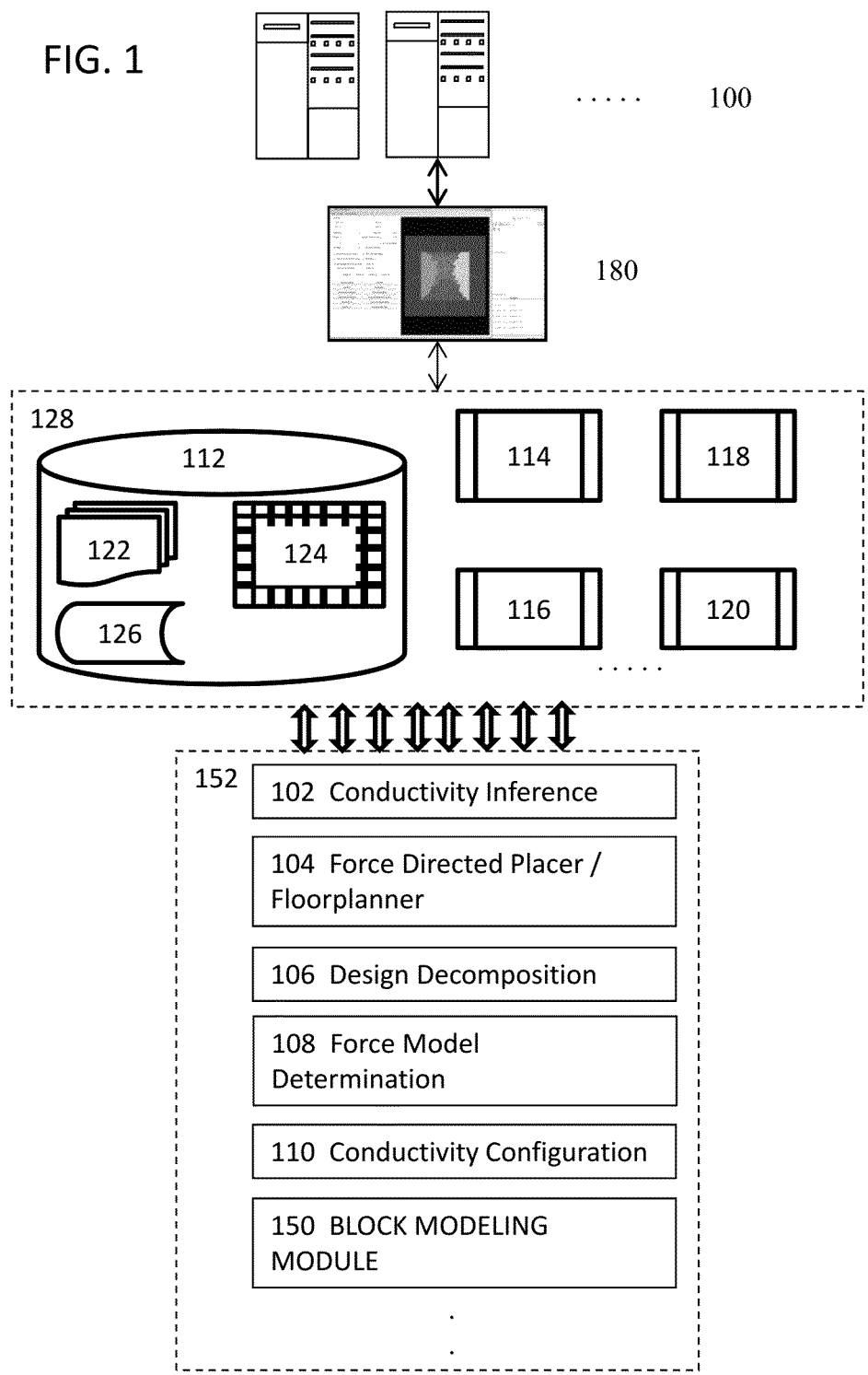
FIG. 1 illustrates a schematic representation of exemplary implementations for implementing physical designs with force directed placement or floorplanning and layout decomposition in some embodiments.

FIG. 1 illustrates a high level block diagram for implementing physical design decomposition with custom connectivity in some embodiments. In one or more embodiments, the system for implementing physical design decomposition with custom connectivity may comprise one or more computing systems 100, such as a general purpose computer described in the System Architecture Overview section to operate on an electronic design in a user interface 180 in order to implement one or more special proposes.

In some embodiments, the one or more computing systems 100 may invoke various system resources such as the processor(s) or processor core(s), memory, disks, etc. The one or more computing systems 100 may also initiate or interact with other computing systems to access various resources 128 that may comprise a global routing engine and/or a detail routing engine 114, a layout editor 116, a design rule checker 118, a verification engine 120, etc. The one or more computing systems 100 may further write to and read from a local or remote volatile or non-volatile computer accessible storage 112 that stores thereupon data or information such as, but not limited to, one or more databases (124) such as schematic design database(s) or physical design database(s), libraries, data, rule decks, constraints, etc. (122), or other information or data (126) that may be used to facilitate the performance of various functions to achieve the intended purposes.

In some embodiments, the one or more computing systems 100 may, either directly or indirectly through various resources 128, invoke various software, hardware modules, or a combination thereof 152 that may comprise a conductivity or connectivity (hereinafter conductivity) inference module 102 to infer conductivity for a physical design or a portion thereof, a force directed placement or floorplanning module 104 to perform the placement or floorplanning functions for the physical design or a portion thereof, a design decomposition or partitioning module 106 to partition an area of a physical design into a plurality of cells, regions, or blocks (hereinafter cells) either alone or jointly with one or more other modules, a force model determination modules 108 to determine various characteristics, parameters, variables, etc. for one or more force models, or a conductivity reconfiguration engine 110 to reconfigure some conductivity for a physical design or a portion thereof, etc.

Figure 2:
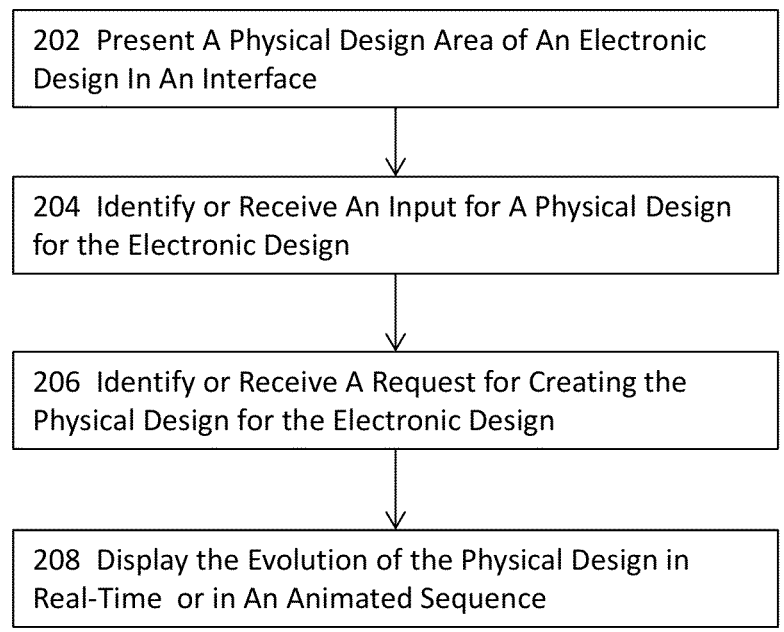
FIG. 2 illustrates a top level flow diagram for providing evolving information in generating a physical design with custom conductivity using force models and design space decomposition in some embodiments.

FIG. 2 illustrates a top level flow diagram for providing evolving information in generating a physical design with custom conductivity using force models and design space decomposition in some embodiments. In one or more embodiments, the process for providing evolving information in generating a physical design with custom conductivity using force models and design space decomposition illustrated in FIG. 2 may comprise the process 202 of presenting a physical design area of an electronic design in an interface. In some embodiments, the process of FIG. 2 may further comprise the process 204 of identifying or receiving an input for a physical design for the electronic design. In some embodiments, the system executing the process illustrated in FIG. 2 automatically.

In some other embodiments, the process 204 identifies the input for a physical design from a user. In some embodiments, the input may include, for example but not limited to, conductivity information for the physical design, constraint(s), various parameters or constants used in the processes described herein, characteristics of the physical design such as the total number of nodes in the physical design, the total number of nodes at a hierarchical level, the total number of child nodes in a parent cell, etc., or any other information or data about the physical design or about the generation of the physical design.

In some embodiments, the process of FIG. 2 may further comprise the process 206 of identifying or receiving a request for creating the physical design for the electronic design. In some embodiments, the request may be received or identified from user's input by, for example, instructing the system executing various processes described herein to proceed with generating the physical design via a user interface.

In some embodiments, the process of FIG. 2 may further comprise the process 208 of displaying the evolution of the physical design. In these embodiments, process 208 displays how the physical design evolves throughout the entire physical design generation process. In some embodiments, process 208 displays the evolving physical design during the physical design creation process in substantially real-time. It shall be noted that the term substantially is used here to reflect the fact that every computation requires some time to complete, and that rendering or displaying the computational result at 208 also requires some time to complete, regardless of how fast the computing system may perform these tasks. In some embodiments, process 208 displays the evolving physical design during the physical design creation process in an animated sequential forward or backward order. In some embodiments, process 208 displays the evolving physical design during the physical design creation process in an animated sequence by capturing multiple states of the physical design during the physical design creation process and displaying these captured multiple states of the physical design.

Figure 3:
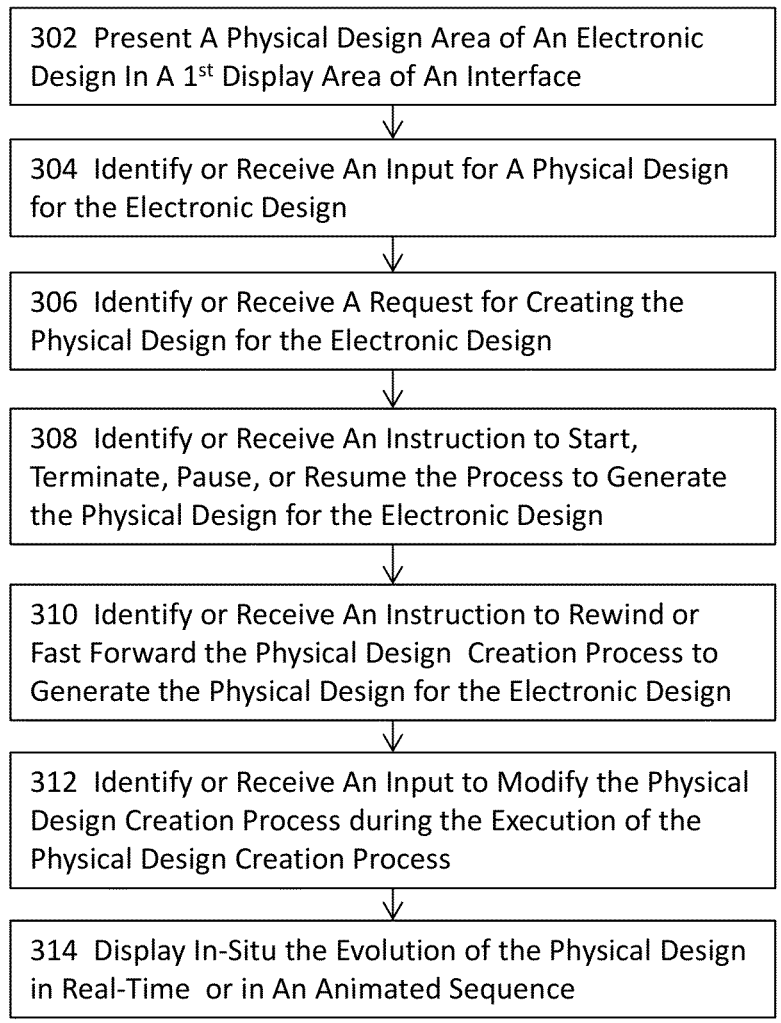
FIG. 3 illustrates a more detailed flow diagram for providing evolving information in generating a physical design with custom conductivity using force models and design space decomposition in some embodiments.

FIG. 3 illustrates a more detailed flow diagram for providing evolving information in generating a physical design with custom conductivity using force models and design space decomposition in some embodiments. In one or more embodiments, the process for providing evolving information in generating a physical design with custom conductivity using force models and design space decomposition illustrated in FIG. 3 may comprise the process 302 of presenting a physical design area of an electronic design in an interface. In some embodiments, process 302 presents the physical design area together with a plurality of interface items. More details about some exemplary interface items will be described in subsequent paragraphs with reference to FIG. 4.

In some embodiments, the process of FIG. 3 may further comprise the process 304 of identifying or receiving an input for a physical design for the electronic design. In some embodiments, the input may include, for example but not limited to, conductivity information for the physical design, constraint(s), various parameters or constants used in the processes described herein, characteristics of the physical design such as the total number of nodes in the physical design, the total number of nodes at a hierarchical level, the total number of child nodes in a parent cell, etc., or any other information or data about the physical design or about the generation of the physical design.

In some embodiments, the process of FIG. 3 may further comprise the process 306 of identifying or receiving a request for creating the physical design for the electronic design in a substantially similar manner as that described for 206.

In some embodiments, the process of FIG. 3 may further comprise the process 308 of identifying or receiving an instruction to start, terminate, pause, or resume the process to generate the physical design for the electronic design. For example, a user may start and terminate a physical design generation process at any time. As another example, a user may pause a physical design generation process during the execution of the physical design generation process to perform various checks, evaluations, or modifications, etc. and resume the execution of the physical design generation process once the various checks, evaluations, or modifications, etc. are completed without losing any design related information or data by saving the states of various processes, programs, and/or the generated design. In some embodiments, the process 308 identifies or receives such an instruction from a user's input via a user interface.

In some embodiments, the process of FIG. 3 may further comprise the process 310 of identifying or receiving an instruction to rewind or fast forward the physical design creation process to generate the physical design for the electronic design. In some embodiments, process 310 provides the capability of rewinding or fast forwarding the physical design process to the user during the execution or after the completion of the physical design generation process such that the user may intervene and modify various parts of the physical design generation process or the physical design itself to produce a more desirous physical design. More details about modifying various parts of the physical design generation process or the physical design itself are described in subsequent paragraphs with reference to FIG. 4. In some embodiments, the process 310 identifies or receives an instruction from a user's input via a user interface.

In some embodiments, the process of FIG. 3 may further comprise the process 312 of identifying or receiving an input to modify the physical design creation process or one or more aspects of the physical design itself. In some of these embodiments, process 312 identifies or receives an input to modify the physical design creation process during the execution of the physical design creation process. In these embodiments, any modifications to the physical design generation process will be captured and applied to the same instance(s) of the physical design generation process, without exiting, terminating, or completing the current instant(s) of the physical design generation process. For example, process 312 may identify or receive an input from a user via the user interface to add one or more additional force models to or remove one or more existing force models from the force models used in the physical design generation process in some embodiments.

In some embodiments, process 312 may identify or receive an input from a user via the user interface to modify one or more parameter values, constants, relations between some parameters, etc. in, for example, one or more force models. In some embodiments, process 312 may identify or receive an input from a user via the user interface to add, remove, or change conductivity information for, for example, one or more nodes or cells. For example, one or more force models. In some embodiments, process 312 may identify or receive an input from a user via the user interface to identify, specify, or modify one or more convergence or stopping criteria. For example, the process 312 may allow the user to alter the threshold value of standard deviation of certain measure or a threshold value of an energy level below which the physical design generation process is deemed converged. In some embodiments, the process 312 identifies or receives an input from a user's input via a user interface.

In some embodiments, the process of FIG. 3 may further comprise the process 314 of displaying in-situ the evolution of the physical design. In some embodiments, process 314 displays in-situ how the physical design evolves during the physical design generation process by applying any modifications to the physical design generation process or to one or more aspects of the physical design itself that are captured during the execution of the physical design generation process, without exiting, terminating, or completing the current instance(s) of the physical design generation process.

FIG. 4 illustrates a schematic representation of an exemplary user interface for providing evolving information in generating a physical design with custom conductivity using force models and design space decomposition in some embodiments. In some embodiments, the exemplary user interface may include UI (user interface) menu items 402, a control panel 404, a design display area 406, a details display area 408, one or more pop-up display areas 410, and/or a user interface for identification of one or more design elements 412. In some embodiments, the UI menu items 402 allow a user to interact with the software applications including typical menu items such as "File", "Edit", "Help", etc. In some embodiments, a control panel 404 may include one or more force model controls, one or more decomposition engine controls, one or more design controls, one or more design generation process controls, one or more fields for specifying, identifying, or modifying one or more design requirements, or one or more options for the display control.

In some embodiments, the one or more force model controls may include, for example but not limited to, controls over the value(s) for parameter(s) or constant(s), etc., controls over which force model is to be included or excluded in the design generation process, controls over one or more convergence or stopping criteria in the application or operation of one or more forces models to the physical design, or any other controls over any adjustable, tunable, or optional aspect of any force models, etc. In some embodiments, the one or more decomposition engine controls may include, for example but not limited to, hierarchical design decomposition, flat design decomposition, the total number of nodes used for decomposition for a cell, a hierarchical level, or the entire design, the total number of cells for a hierarchical levels or for the entire design, one or more convergence or stopping criteria, adding child node(s) to a particular cell, one or more hierarchical levels, or a design, etc.

In some embodiments, the one or more design controls may include, for example but not limited to, conductivity for a node, a cell, a group of nodes, a group of cells, one or more hierarchical levels, or the entire design, the total number of nodes used for decomposition for a cell, a hierarchical level, or the entire design, the total number of cells for a hierarchical levels or for the entire design, etc. In some embodiments, the one or more design generation process controls may include, for example but not limited to, starting, terminating, pausing, resuming, rewinding, or fast forwarding the design generation process, etc. In some embodiments, the one or more design requirements may include, for example but not limited to, one or more constraints, one or more design rules, one or more design rule decks, compliance check results for the one or more constraints, one or more design rules, one or more design rule decks, description or legends for the compliance check results, hints or suggestions for non-compliance, etc. In some embodiments, the one or more options for the display control may include, for example but not limited to, on/off control for various display items, color or thermal map controls for various display items, etc.

In some embodiments, the design display area 406 may provide in-situ response to one or more modifications of design or one or more modifications to various processes used to generate the designs and display the design in the design display area 406 accordingly. In some embodiments, the display area 406 may present animated, substantially real-time, or sequential display of the evolving design during the design generation process in the normal order or in a reverse order. In some embodiments, the design display area may present context-based display of design related information based at least in part upon, for example, a user's manipulation of the design, the design environment (e.g., the various processes or engines), the user interface, or an input device (e.g., a keyboard or a pointing device), etc. For example, FIG. 13E shows a brief summary of information of the cell when a user manipulates the pointing device so the pointing cursor hovers over the cell in the design.

The design details display area 408 may display, for example but not limited to, detailed design related information such as detailed information of a design element (e.g., a node, a cell, a hierarchical level, the entire design, etc.), execution results (e.g., deviations of a node, a cell, a group of nodes or cells, the entire design, etc. from prescribed value(s) or criteria for convergence, etc.) as the design generation process progresses, hints or suggestions or help for a non-compliance of a constraint, rule, or requirement or hints or suggestions or help for any of the controls described herein, one or more assisted or automated fixes or one or more options for fixing a particular non-compliance or violation, etc.

In some embodiments, the user interface for identification of one or more design elements 412 may provide a user with the capability to identify or select various elements from a design for, for example, reporting, evaluation, analysis, modification, etc. For example, a user may identify or select a cell by clicking on the cell in the design display area 406 through the user interface 412. In some embodiments, the exemplary user interface illustrated in FIG. 4 may also include one or more pop-up display areas such as a pop-up balloon, a pop-up window, combinations, or any other suitable pop-up display areas to display any of the information that a user may need or desire to know.

Figure 5:
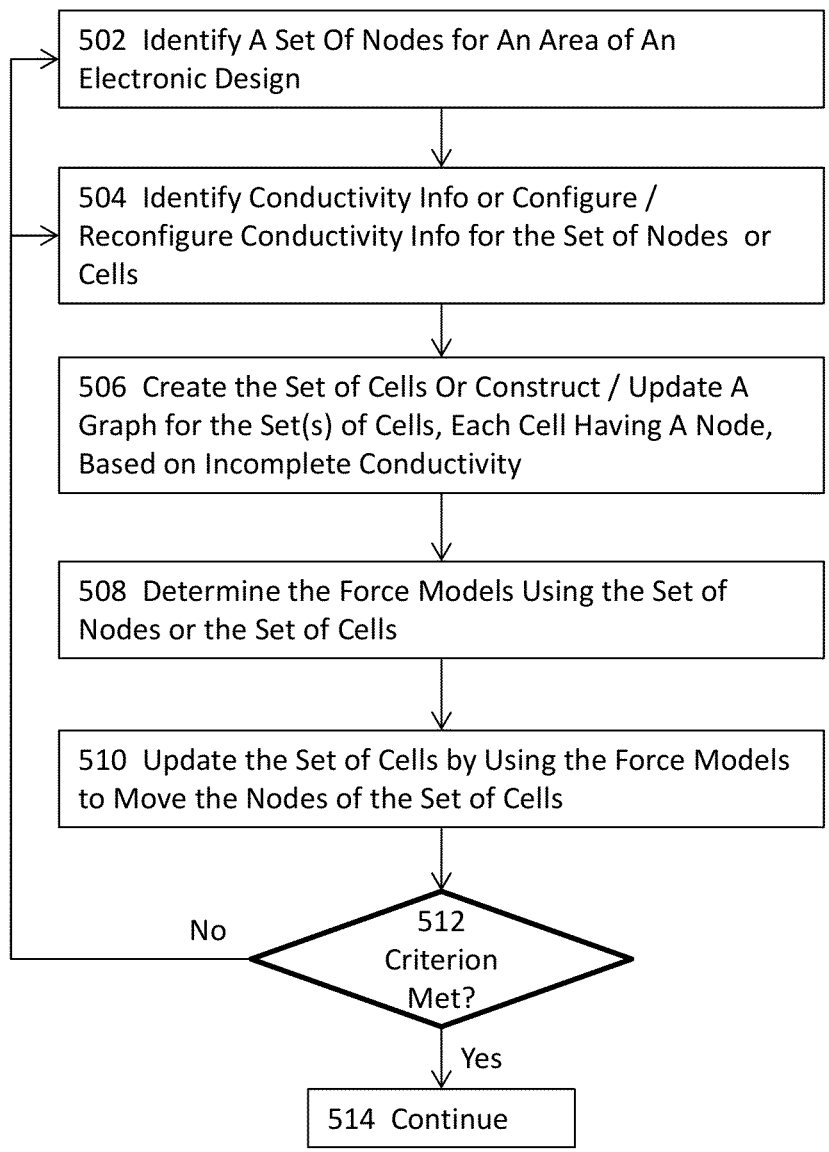
FIG. 5 illustrates a top level flow diagram for implementing a physical design having multiple hierarchical levels using one or more force models in some embodiments.

FIG. 5 illustrates a top level flow diagram for implementing physical designs with force directed placement or floorplanning and layout decomposition in some embodiments. In one or more embodiments, the method for implementing physical designs with force directed placement or floorplanning and layout decomposition may comprise the process 502 of identifying a set of nodes for a physical design area of an electronic design, if the set of cells has been generated.

In some embodiments, the method may comprise the process 504 of identifying conductivity information or configure or reconfigure conductivity information for the set of nodes or for the set of cells if the set of cells is identified at 502. In some embodiments, the conductivity information may comprise partial, incomplete conductivity for the physical design area of the electronic design. In some embodiments, the conductivity information may comprise user specified conductivity information. In some embodiments, the conductivity information does not necessarily dictate how a first design block (e.g., an intellectual property or IP block or generally any group of electronic design components of an electronic design) is precisely connected to other blocks. Rather, the conductivity information may merely indicate that the first design block communicates with (e.g., exchanging data) or and is thus somehow connected to these other blocks. That is, the conductivity information does not necessarily specify, for example, which port of one design block is to be connected to another port of another design block but simply indicates that a design block communicates to another design block. More details are described in U.S. patent application Ser. No. 13/842,706 entitled "METHODS, SYSTEMS, AND ARTICLES OF MANUFACTURE FOR IMPLEMENTING PHYSICAL DESIGN DECOMPOSITION WITH CUSTOM CONNECTIVITY", the content of which is hereby incorporated by reference in its entirety for all purposes.

In some embodiments, the method may comprise the process 506 of creating a set of cells, each of which contains a node (e.g., a Voronoi generation node) in the set of nodes identified at 502, based on the conductivity information identified at 504. In some embodiments, process 506 creates the set of cells by using Voronoi decomposition process that generates the set of Voronoi cells by using the Voronoi decomposition process. More details about the Voronoi cells are described in are described in U.S. patent application Ser. No. 13/842,706 entitled "METHODS, SYSTEMS, AND ARTICLES OF MANUFACTURE FOR IMPLEMENTING PHYSICAL DESIGN DECOMPOSITION WITH CUSTOM CONNECTIVITY", the content of which is hereby incorporated by reference in its entirety for all purposes.

In some embodiments, the graph constructed or updated at 506 may be used in force directed placement or floorplanning to determine the locations of the nodes using one or more force models based at least in part upon the conductivity information. In some embodiments where the set of cells has not been created such as the case when the physical design area has not been partitioned, process 506 may construct the graph using a set of nodes that is provided for partitioning the physical design area. The set of nodes may represent, for example, the top level blocks, cells, macros, etc. that belong to the highest hierarchical level of the electronic design that may be obtained or derived from, for example, the functional specification of the electronic design.

In some embodiments, the method may comprise the process 508 of determining force models for the graph. In some embodiments, process 508 may determine one or more force models using the set of nodes identified at 502 or the set of cells created at 506. In some embodiments where the physical design space has not been partitioned, and thus the set of cells has not been created, process 508 may then determine one or more force models that can be determined with the characteristics of the cells such as the spring attractive force model, the electrical repulsive force model, the containment force model, etc. In some embodiments where the set of cells has been identified at 502, process 508 may thus generate all needed force models.

In some embodiments, the one or more force models comprise a containment force model, a cell-based force model, or a Voronoi attractive force model. More details about the force models are described in are described in U.S. patent application Ser. No. 13/842,706 entitled "METHODS, SYSTEMS, AND ARTICLES OF MANUFACTURE FOR IMPLEMENTING PHYSICAL DESIGN USING FORCE MODELS", the content of which is hereby incorporated by reference in its entirety for all purposes.

In some embodiments, the method may comprise the process 510 of updating the set of cells by using the force models to move at least some of the nodes of the set of cells to the respective new locations. In some embodiments where the set of cells has not been generated, process 510 may use the force models generated at 508 and apply various forces on the nodes identified at 502 based at least in part upon the conductivity information. These various forces acting on a node are thus added by using vector operations to determine the resultant force for the node. The result node may thus move the node.

It shall be noted that the forces acting on a node may change when the node moves. In some embodiments where a set of Voronoi cells is identified at 502, the set of Voronoi cells also changes when the nodes move and further changes the forces that are determined based at least in part upon the cells. In some embodiments where a set of Voronoi cells has been used, the set of Voronoi cells continuously changes with the move of the nodes, and process 510 may continuously update the set of Voronoi cells as the set of nodes continuously move.

In some embodiments, the method may comprise the process 512 of determining whether one or more convergence criteria have been satisfied. In some embodiments where the graph is constructed with a set of cells (e.g., the set of cells identified at 502), the one or more convergence or stopping criteria may comprise, for example but not limited to, a reduced or a minimum energy level. In some embodiments where the set of cells has been identified at 502, the one or more convergence or stopping criteria may comprise, for example but not limited to, a target area requirement or goal (hereinafter goal), a wire length goal, a timing goal, a reduced or minimum energy level, etc.

In some embodiments where the one or more convergence or stopping criteria are not satisfied, the method may return to 502 to update or create the set of cells with the set of nodes at the new locations. In some embodiments where the one or more criteria are not satisfied, the method may return to 504 to configure or reconfigure the conductivity information. More details about configuring or reconfiguring the conductivity information are described in U.S. patent application Ser. No. 13/842,706 entitled "METHODS, SYSTEMS, AND ARTICLES OF MANUFACTURE FOR IMPLEMENTING PHYSICAL DESIGN DECOMPOSITION WITH CUSTOM CONNECTIVITY", the content of which is hereby incorporated by reference in its entirety for all purposes. In embodiments where the one or more convergence or stopping criteria are satisfied at 512, the method may proceed to 514 to continue with, for example, storing the generated floorplan or placement layout for the physical design area using the final set of cells.

Figure 6:
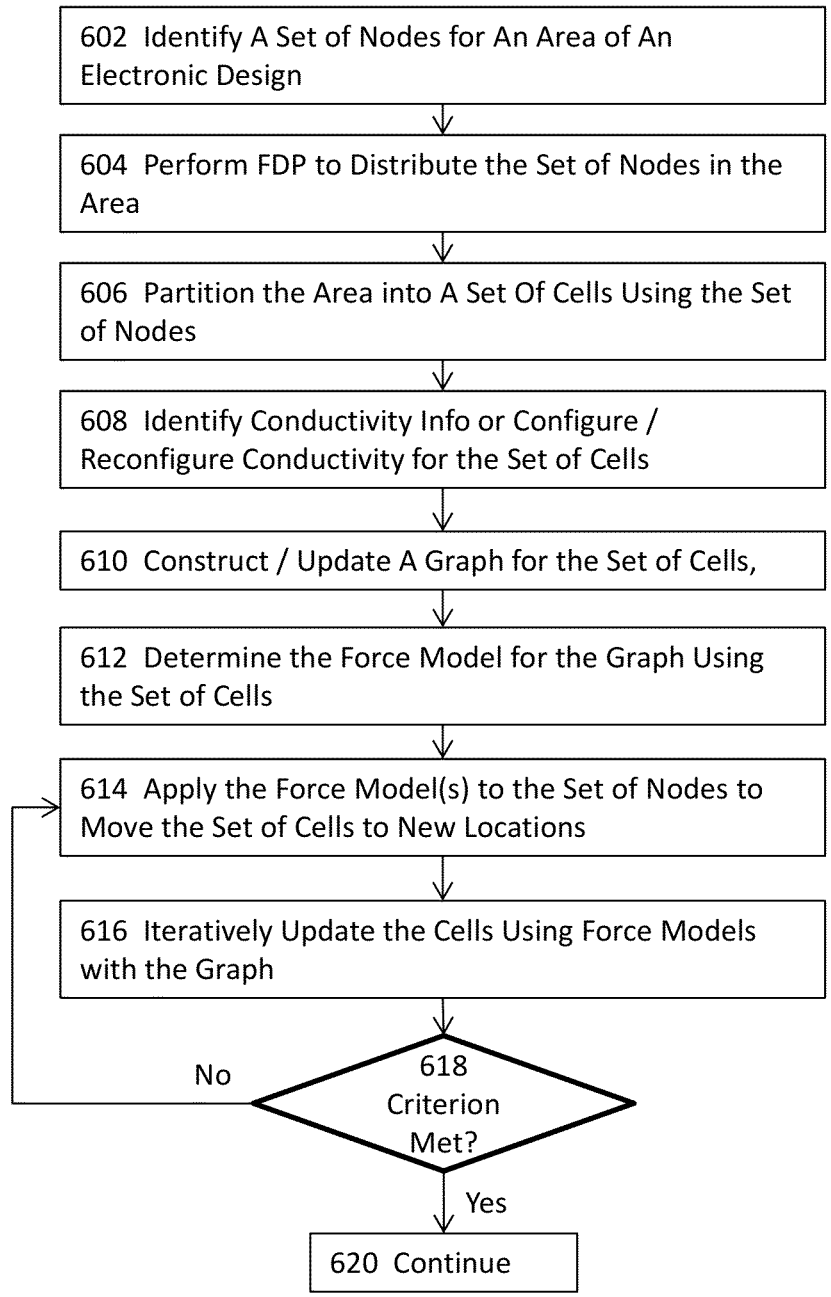
FIG. 6 illustrates more details about a top level flow diagram for implementing physical design decomposition with custom connectivity in some embodiments.

FIG. 6 illustrates more details about a more detailed flow diagram for implementing physical designs with force directed placement or floorplanning and layout decomposition in some embodiments. In one or more embodiments, the method may comprise the process 602 of identifying a set of nodes for an area of an electronic design. In these embodiments illustrated in FIG. 6, the method uses a decomposition process to partition the design by using the set of nodes.

In some embodiments, the method may comprise the process 604 of performing force based placement or floorplanning to distribute the set of nodes in the physical design area. In some embodiments, process 604 performs the force based placement or floorplanning by using a graph constructed based on the set of nodes. In some embodiments, process 604 performs the force based placement or floorplanning by using some conductivity information (e.g., some user-specified conductivity information) and the set of nodes. In the absence of conductivity information, the method may distribute the set of nodes within the physical design area and then infer conductivity between some adjacent nodes in one or more different ways. For example, the method may first uniformly or randomly distribute the set of nodes within the physical design area and infer conductivity among some adjacent nodes based at least in part upon, for example, functional requirements, conductivity in other related designs, etc.

In some embodiments, the method may comprise the process 606 of partitioning the area into a set of cells using the set of nodes. In some embodiments where the design is partitioned into a plurality of Voronoi cells, the set of nodes represent the Voronoi generation nodes. In some embodiments, the method may comprise the process 608 of identifying conductivity information or configuring or reconfiguring the conductivity information for the set of cells in a substantially similar manner as that described for 204.

In some embodiments, the method may comprise the process 610 of constructing a graph for the set of cells or updating the graph if the graph has already been constructed based at least in part upon the conductivity information. For example, the conductivity information may require that a first node in the set of nodes be connected to a second node or to a particular component such as an IO cell. Process 610 may then create or update the graph by using at least the conductivity information. The conductivity information may be partial and incomplete in some embodiments. The method may thus further infer additional conductivity information. More details about inferring, configuring, or reconfiguring conductivity information are described in U.S. patent application Ser. No. 13/842,706 entitled "METHODS, SYSTEMS, AND ARTICLES OF MANUFACTURE FOR IMPLEMENTING PHYSICAL DESIGN DECOMPOSITION WITH CUSTOM CONNECTIVITY", the content of which is hereby incorporated by reference in its entirety for all purposes.

In some embodiments, the method may comprise the process 612 of determining one or more force models for the graph using at least the set of cells in a substantially similar manner as that described for 208. In some embodiments, the method may comprise the process 614 of applying the one or more force models on the set of nodes to move the set of nodes to the respective new locations in a substantially similar manner as that described for 210. In some embodiments, the method may comprise the process 616 of iteratively updating the set of cells based at least in part on the results of process 614.

In some embodiments, the method may comprise the process 618 of determining whether one or more convergence or stopping criteria are satisfied. For example, process 618 may determine whether the set of cells meet certain prescribed standard deviation from the target area goal. In some embodiments where the one or more convergence criteria are not satisfied, the method may return to 614 to repeat the processes 614~618 until the one or more convergence or stopping criteria are satisfied. Otherwise, the method may proceed to 620 to continue with, for example, storing the generated floorplan or placement layout for the physical design area using the final set of cells.

Figure 7:
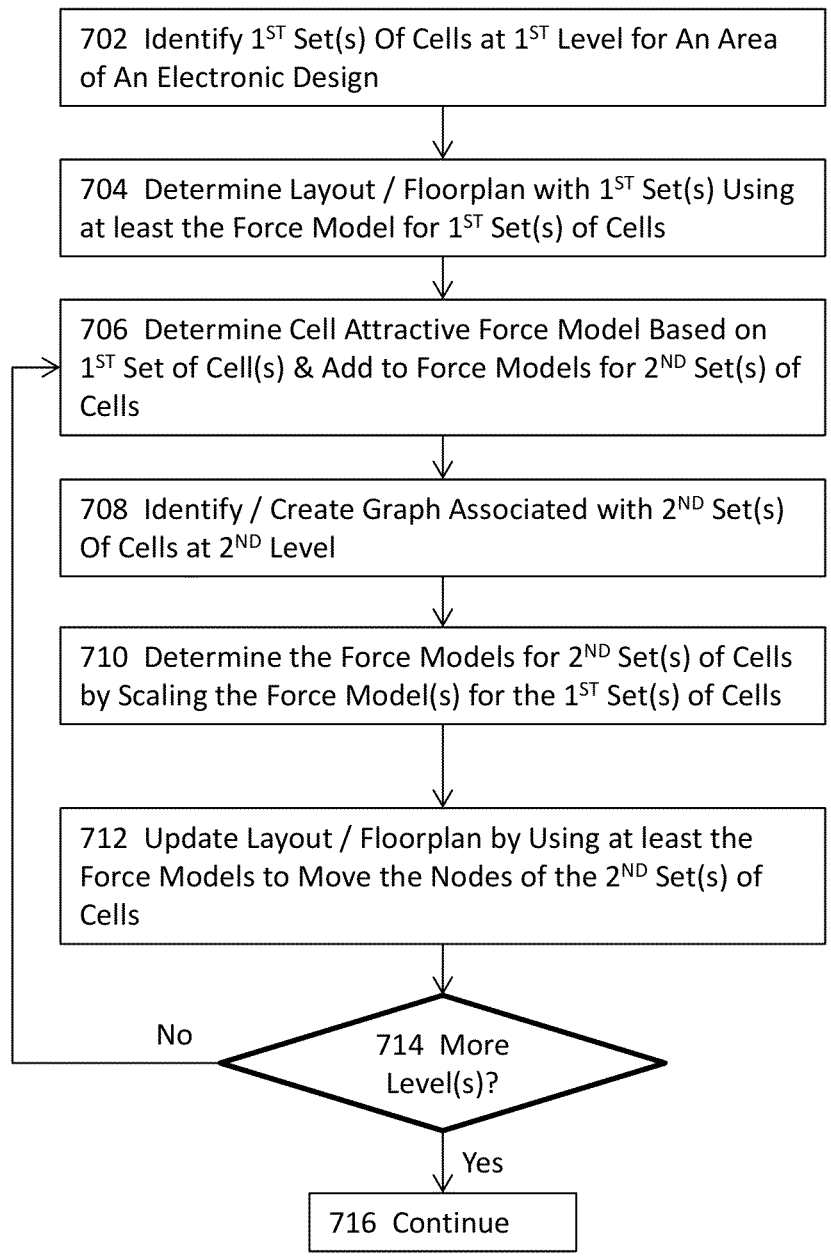
FIG. 7 illustrates a top level flow diagram for implementing multi-hierarchy physical design decomposition with custom connectivity in some embodiments.

FIG. 7 illustrates a top level flow diagram for implementing a physical design having multiple hierarchical levels using one or more force models in some embodiments. In one or more embodiments, the method illustrated in FIG. 7 may comprise the process 702 of identifying a first set of cells at a first hierarchical level for an area of an electronic design. In some embodiments where a top-down approach is adopted, the first hierarchical level represents the highest hierarchical level of the electronic design.

In some embodiments, the method may comprise the process 704 of determining the placement layout or the floorplan using at least one or more force models described herein on the first set of cells. For example, the method may determine to use one or more attractive force models, one or more repulsive force models, a containment force model, and a cell-based force model for a user-defined, physical electronic design (e.g., the edges or nodes in a graph layout comprise user-defined elements) in some embodiments. The method may also determine to use one or more attractive force models (e.g., Voronoi attractive force model or cell attractive force model) and a containment force model for a physical electronic design that is derived by using the Voronoi-based graph layout to drive a Voronoi diagram to the target area convergence or stopping criterion in some embodiments. The method may also determine to use one or more attractive force models (e.g., Voronoi attractive force model or cell attractive force model), one or more repulsive force models, and a containment force model for a physical electronic design that is derived by using the Voronoi-based graph layout to drive a Voronoi diagram to the target area convergence or stopping criterion in some embodiments.

In some embodiments, the method may comprise the process 706 of determining the cell attractive force model based at least in part on the first set of cell and adding the cell attractive force model to the force models that are used for the second sets of cells. In these embodiments, the additional cell attractive force model will also be used to calculate the attractive force vectors, in addition to the other force model(s). In some embodiments, the method may comprise the process 708 of identifying or creating a graph by using the second set of cells at the second hierarchical level. In some embodiments, the graph includes vertices, each of which represents a cell in the second set, and edges, each of which indicates two nodes are connected in the graph as indicated by the conductivity information.

In some embodiments, the method may comprise the process 710 of determining the force models that are used for the second set of cells at the second hierarchical level by scaling or modifying the corresponding force models for the first set of cells at the first hierarchical level. More details about process 710 are described in U.S. patent application Ser. No. 13/843,706 entitled "METHODS, SYSTEMS, AND ARTICLES OF MANUFACTURE FOR IMPLEMENTING PHYSICAL DESIGN USING FORCE MODELS", the content of which is hereby incorporated by reference in its entirety for all purposes.

In some embodiments, the method may comprise the process 712 of updating the placement layout or the floorplan by using at least the force models to move the nodes of the second set of cells. In some embodiments, the method iteratively moves the nodes of the second set of cells until one or more convergence or stopping criteria are satisfied. In some embodiments, the method may comprise the process 714 of determining whether there is an additional hierarchical level to be further processed. In some embodiments where there is an additional hierarchical level to be further processed, the method may return to 706 and repeat the processes 706~714 until all the levels of interest have been processed. Otherwise, the method may proceed to 716 to continue with, for example, storing the generated placement layout or floor plan.

Figure 8:
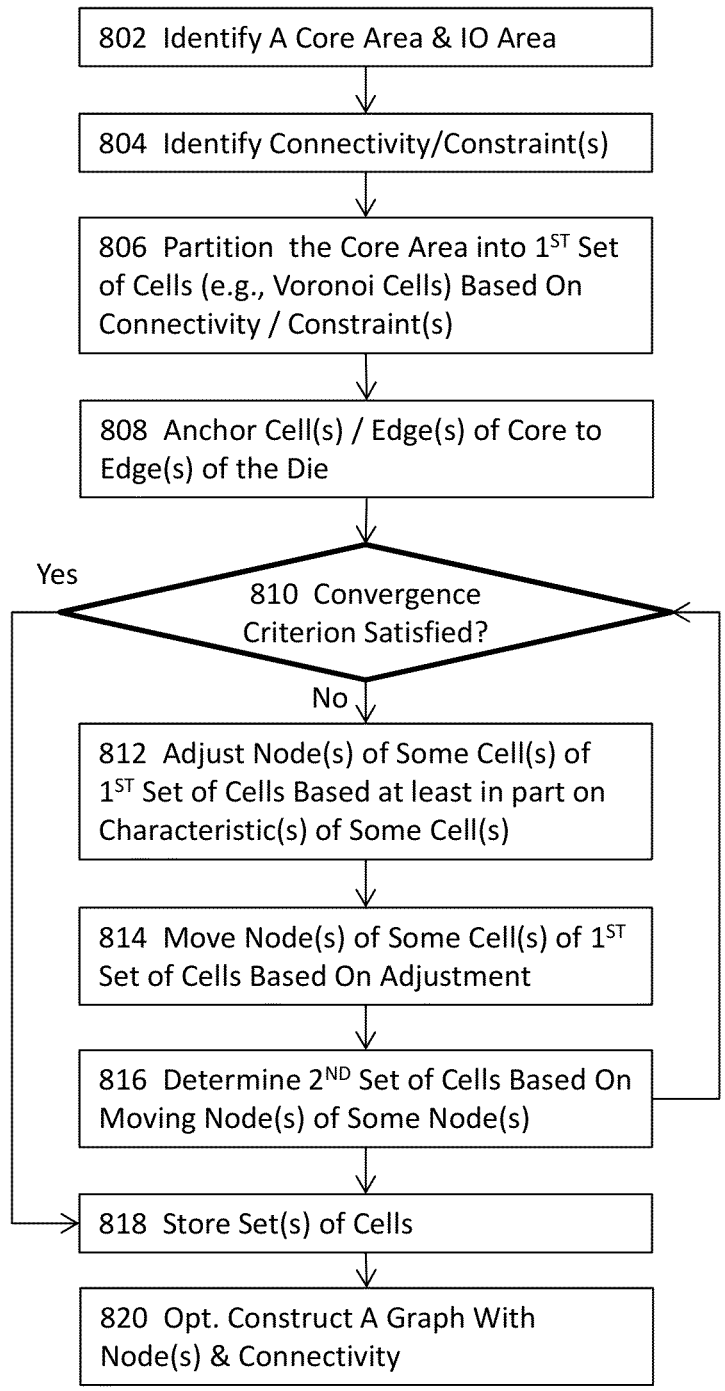
FIG. 8 illustrates more details about a top level flow diagram for implementing physical designs using force models in some embodiments.

FIG. 8 illustrates more details about a top level flow diagram for implementing physical design decomposition with custom connectivity in some embodiments. In one or more embodiments, the method for implementing physical design decomposition with custom connectivity may comprise the process 802 of identifying a core area and an IO area completely or substantially surrounding or enclosing the core area of a die (e.g., an electronic design.) In some embodiments, the method may comprise the process 804 of identifying conductivity information. In some of these embodiments, the conductivity information includes user specified conductivity.

In some embodiments, the method may comprise the process 806 of partitioning the core area into a first set of cells, each containing a node, based at least in part upon the conductivity information identified at 804. In some embodiments, the first set of cells comprise a plurality of Voronoi cells. In some embodiments, the total number of cells into which a design is to be partitioned is known in advance. That is, the partitioning process (e.g., process 606) partitions an area of a design into a given number of cells while observing some custom conductivity and satisfying one or more criteria. In some embodiments, the method may comprise the process 808 of anchoring one or more edges or cells at the edges of the core area to one or more edges of the die while observing or maintaining the conductivity information identified at 804.

In some embodiments, the process 808 may anchor an edge or a cell at the edge by converting the edge of the cell to Voronoi. For example, the process 808 may interact with a force directed placement engine to define the boundary of an IO cell in the IO area as a container and use an attractive force model between the IO cell and the cell to impose the conductivity between the cell and the IO cell in some of these embodiments. In some embodiments, the process 808 anchors the cells neighboring one or more edges of the core area to at least a part of the IO area (e.g., some IO cells in the IO area.) In some embodiments, the process 808 may anchor the cells neighboring one or more edges of the core area to the corresponding cells in the IO area based at least in part upon one or more criteria that may include, for example but not limited to, wire length requirement(s), timing requirement(s), cell area requirement(s), etc.

In some embodiments, the method may comprise the process 810 of determining whether the first set of cells satisfies one or more convergence or stopping criteria. In some of these embodiments where the process 810 determines that the first set of cells satisfies the one or more convergence or stopping criteria, the method may proceed to 818 to store the first set of cells. In some embodiments where the process 810 determines that the first set of cells does not satisfy the one or more convergence or stopping criteria, the method may further comprise the process 812 of adjusting one or more nodes of one or more cells in the first set of cells based at least in part upon one or more characteristics of the corresponding one or more cells.

In some embodiments where one or more force models are used to move the one or more cells, the process 812 adjusts the one or more nodes based at least in part upon how much attractive force or repulsive force a given node in the one or more nodes is to be associated with. The one or more characteristics may include, for example but not limited to, the actual area of each of the one or more cells corresponding to the one or more nodes being adjusted, the number of neighboring cells sharing a common edge with a specific cell, etc. In some embodiments, the method may comprise the process 814 of moving the one or more nodes based at least in part upon the adjustment from 812.

In some embodiments, the process 814 moves the one or more nodes by using one or more models. In some embodiments, the method may comprise the process 816 of determining a second set of cells based at least in part upon the result of moving the one or more nodes, and the method loops back to 810 to re-determine whether the second set of cells meets the one or more convergence or stopping criteria. The method may then iterates through 810 816 until the second set of cells meets the one or more convergence or stopping criteria where the method proceed to 818 as described above.

In some embodiments, the method may optionally comprise the process 820 of constructing a graph using the nodes in the second set of cells and the conductivity information. In some embodiments, each cell is represented in the graph as a node, and an edge connecting two nodes in the graph indicates that the two cells corresponding to the two connected nodes share a common cell boundary. In some embodiments, the method may further use the graph in the force directed placement or floorplanning module 104.

Figure 9:
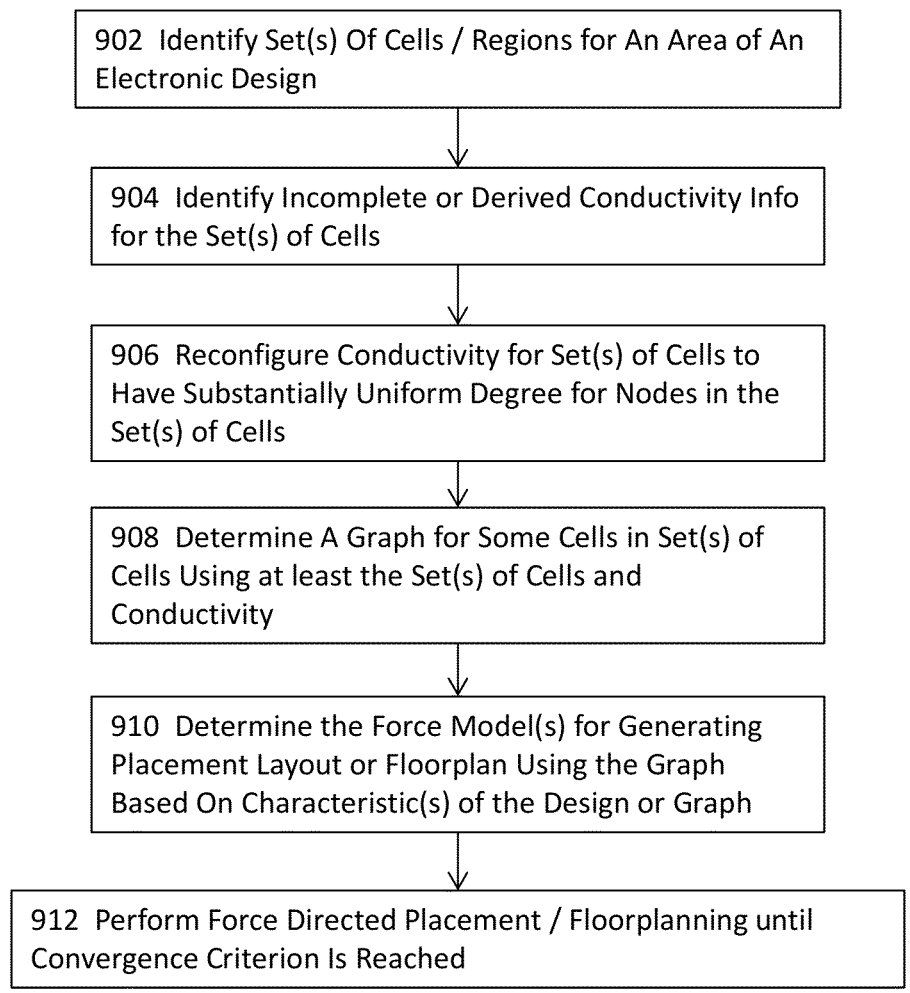
FIG. 9 illustrates more details about the top level flow diagram illustrated in FIG. 8 in some embodiments.

FIG. 9 illustrates more details about a top level flow diagram for implementing physical designs using force models in some embodiments. In one or more embodiments, the method for implementing physical designs using one or more force models illustrated in FIG. 9 may comprise the process 902 of identifying one or more sets of cells for an area of interest in an electronic design. In some embodiments, the method may comprise the process 904 of identifying conductivity information for the one or more sets of cells. In some embodiments, the conductivity information identified at 904 comprises custom conductivity information or partial, incomplete conductivity information.

In some embodiments, the conductivity information may comprise derived or inferred conductivity information that is derived by using at least the one or more sets of cells identified at 902. More details about deriving or inferring conductivity information using at least one or more sets of cells representing decomposition of an electronic design are described in U.S. patent application Ser. No. 13/842,706 entitled "METHODS, SYSTEMS, AND ARTICLES OF MANUFACTURE FOR IMPLEMENTING PHYSICAL DESIGN DECOMPOSITION WITH CUSTOM CONNECTIVITY", the content of which is hereby incorporated by reference in its entirety for all purposes.

In some embodiments, the method may comprise the process 906 of configuring or reconfiguring the conductivity information for at least some cells in the one or more sets of cells to have substantially uniform degree for nodes in the one or more sets of cells. In the graph theory, the degree or valency of a vertex of a graph generally denotes the number of edges incident to the vertex with loops counted twice although some embodiments described herein do not result in any loops. The degree of a vertex of the graph layout constructed by, for example, process 908 also represents the number of neighboring cells of a cell, if the conductivity information has not been configured or reconfigured as described in process 906. More details about configuring or reconfiguring the conductivity information are described in U.S. patent application Ser. No. 13/842,706 entitled "METHODS, SYSTEMS, AND ARTICLES OF MANUFACTURE FOR IMPLEMENTING PHYSICAL DESIGN DECOMPOSITION WITH CUSTOM CONNECTIVITY", the content of which is hereby incorporated by reference in its entirety for all purposes.

In some embodiments, the method may comprise the process 908 of determining a graph for some cells in the one or more sets of cells using at least the one or more sets of cells and the conductivity information. In some embodiments, each cell of the some cells is represented as a vertex in the graph, and an edge between two vertices in the graph indicates that the two vertices are not only adjacent to but also interacting with each other in some embodiments. In some embodiments, the method may comprise the process 910 of determine the force model(s) for generating placement layout or floorplan using the graph based at least in part on one or more characteristics of the design or of the graph.

For example, the method may determine to use one or more attractive force models, one or more repulsive force models, a containment force model, and a cell-based force model for a user-defined, physical electronic design (e.g., the edges or nodes in a graph layout comprise user-defined elements) in some embodiments. The method may also determine to use one or more attractive force models (e.g., Voronoi attractive force model or cell attractive force model) and a containment force model for a physical electronic design that is derived by using the Voronoi-based graph layout to drive a Voronoi diagram to the target area convergence or stopping criterion in some embodiments.

The method may also determine to use one or more attractive force models (e.g., Voronoi attractive force model or cell attractive force model), one or more repulsive force models, and a containment force model for a physical electronic design that is derived by using the Voronoi-based graph layout to drive a Voronoi diagram to the target area convergence or stopping criterion in some embodiments. More details about the decomposition process are described in U.S. patent application Ser. No. 13/842,706 entitled "METHODS, SYSTEMS, AND ARTICLES OF MANUFACTURE FOR IMPLEMENTING PHYSICAL DESIGN DECOMPOSITION WITH CUSTOM CONNECTIVITY", the content of which is hereby incorporated by reference in its entirety for all purposes.

In some embodiments, the method may comprise the process 912 of performing force directed placement or floorplanning to generate a placement layout or a floorplan while maintaining the conductivity information initially identified at 904 until one or more convergence or stopping criterion are satisfied.

Figure 10:
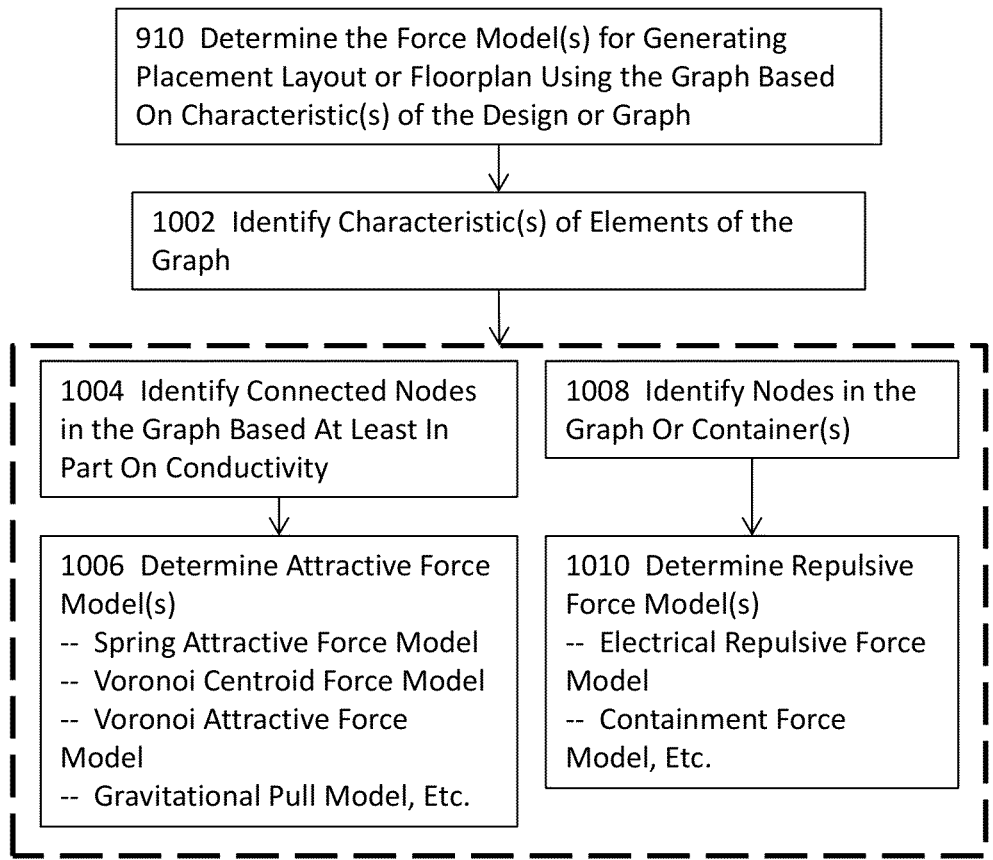
FIG. 10 illustrates more details about the top level flow diagram illustrated in FIG. 9 in some embodiments.

FIG. 10 illustrates more details about the top level flow diagram illustrated in FIG. 8 in some embodiments. More specifically, FIG. 10 illustrates more details about process 910 of FIG. 9. In some embodiments, process 910 may comprise the process 1002 of identifying one or more characteristics of the elements of the graph. For example, process 1002 may identify how an area of interest in the physical design space of an electronic design is partitioned or what kind of decomposition algorithms are used to decompose the area of interest.

In some embodiments, process 910 may comprise the process 1004 of identifying connected nodes in the graph based at least in part on the conductivity information. In some embodiments where Voronoi decomposition is used to partition a design, all nodes of neighboring Voronoi cells may be potentially connected. Nonetheless, the method may optionally configure or reconfigure connectivity among nodes in order to achieve a substantially uniform degree for the graph consisting of the vertices (representing the Voronoi cells) and edges (representing the connectivity). Therefore, the method may optionally identify the connected nodes at 1004 in some embodiments.

In some embodiments, process 910 may comprise the process 1006 of determining one or more attractive force models. The one or more attractive force models may include, for example but not limited to, a spring attractive force model, a cell-based force model (e.g., a Voronoi centroid force model), a Voronoi attractive force model, a gravitational pull force model, or combinations thereof, etc. More details about the force models will be described in subsequent paragraphs with reference to appropriate drawing figures. In some embodiments, process 910 may comprise the process 1008 of identifying nodes in the graph for modeling the one or more repulsive force models. In some embodiments, process 910 may comprise the process 1010 of determining one or more repulsive force models. The one or more repulsive force models may include, for example but not limited to, an electrical repulsive force model, a containment force model, or combinations thereof, etc.

Figure 11A:
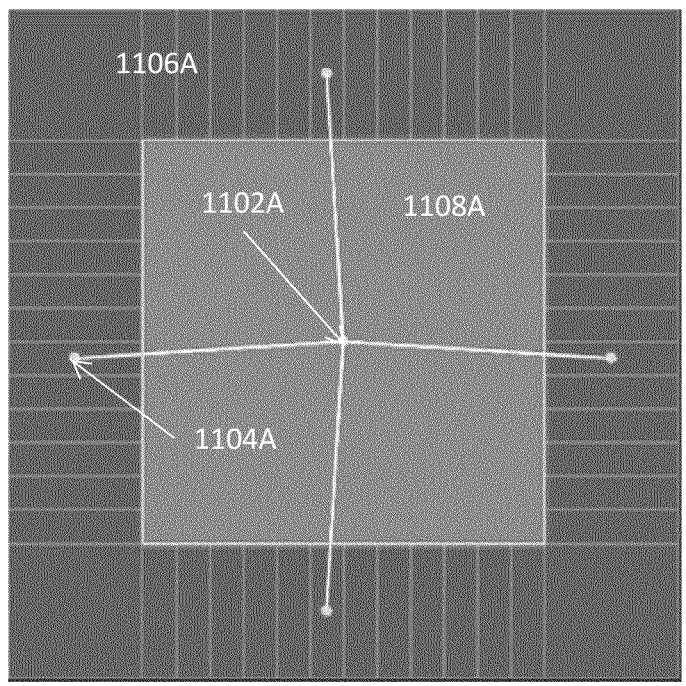
FIGS. 11A-N illustrate the generation of an exemplary floorplan or a placement layout during the implementation of the corresponding physical design using one or more force models operating on sets of cells representing the a physical design space of the physical design in some embodiments.
Figure 11B:
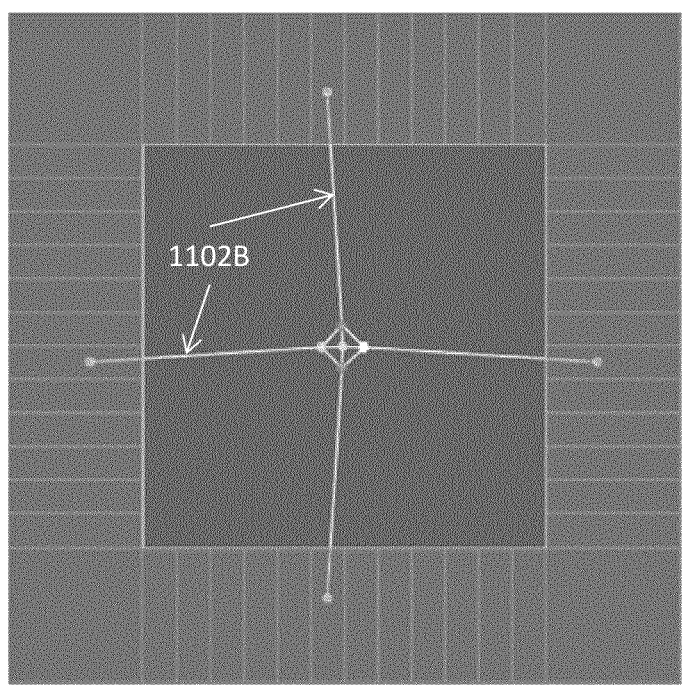
Figure 11C:
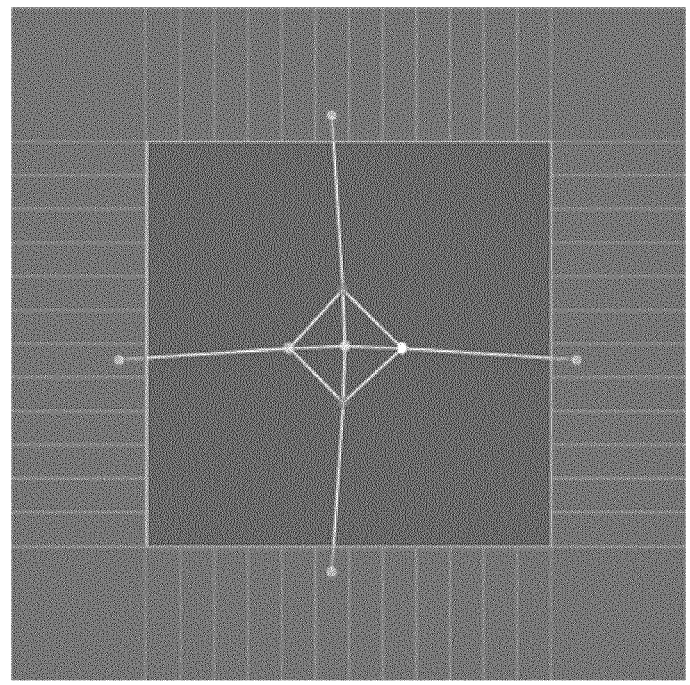
Figure 11D:
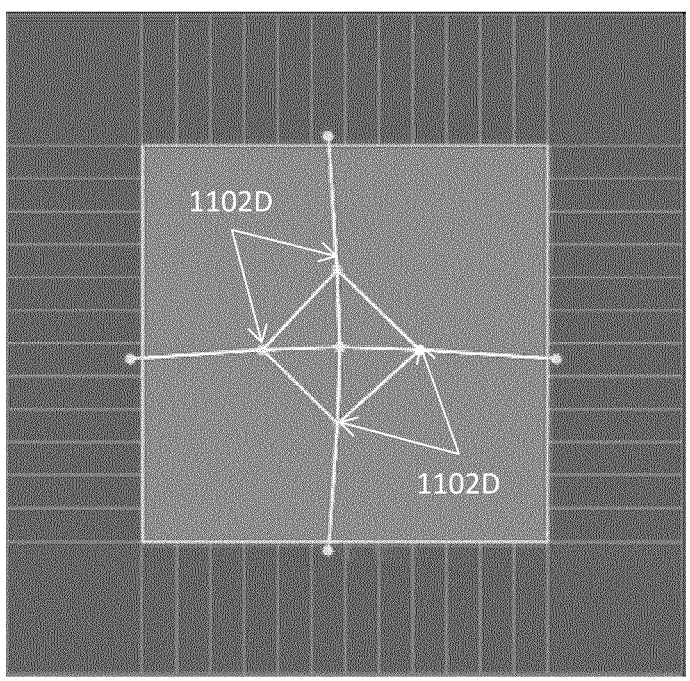
Figure 11E:
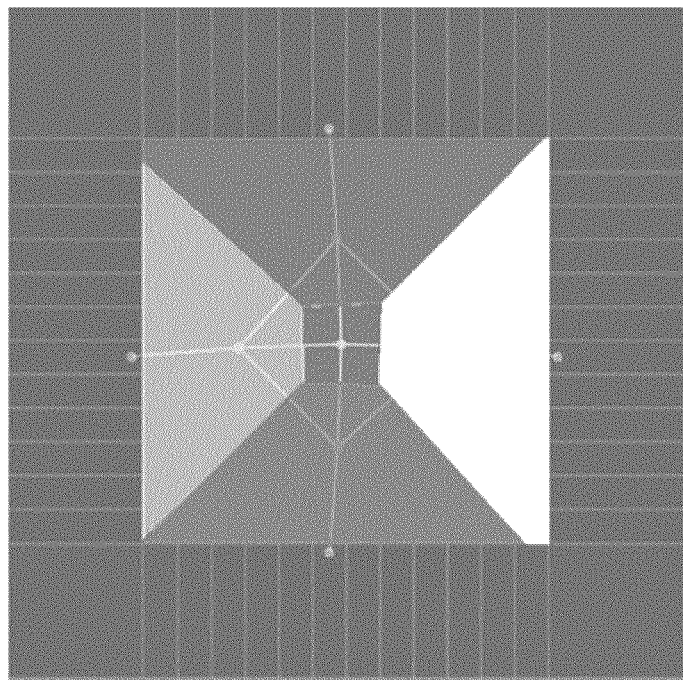
Figure 11F:
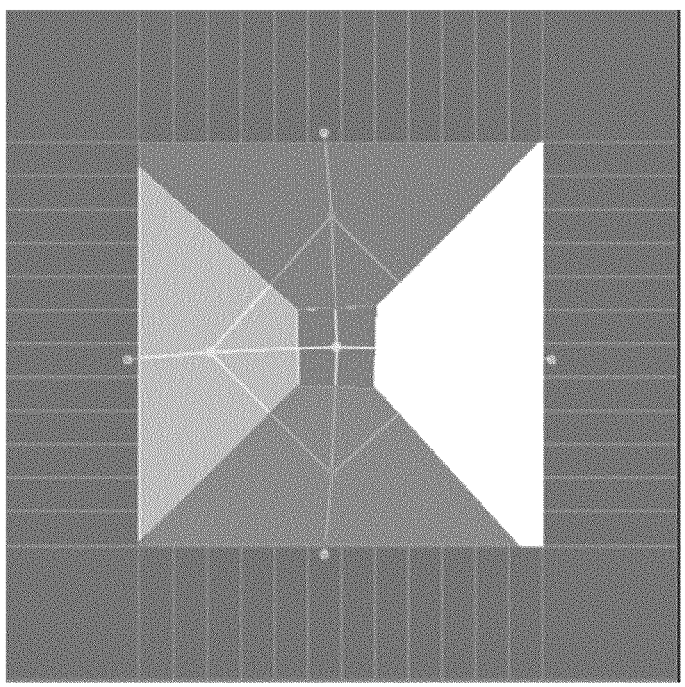
Figure 11G:
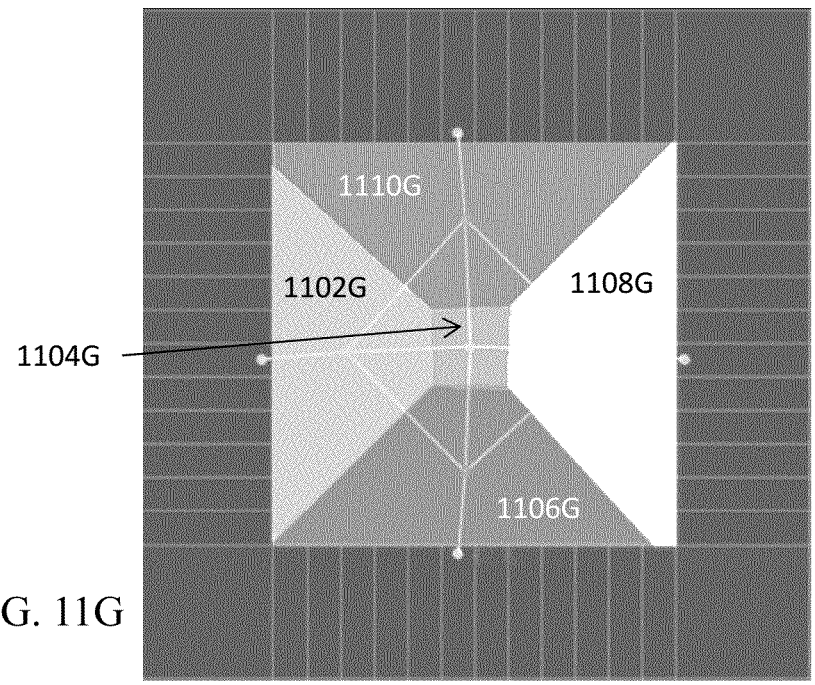
Figure 11H:
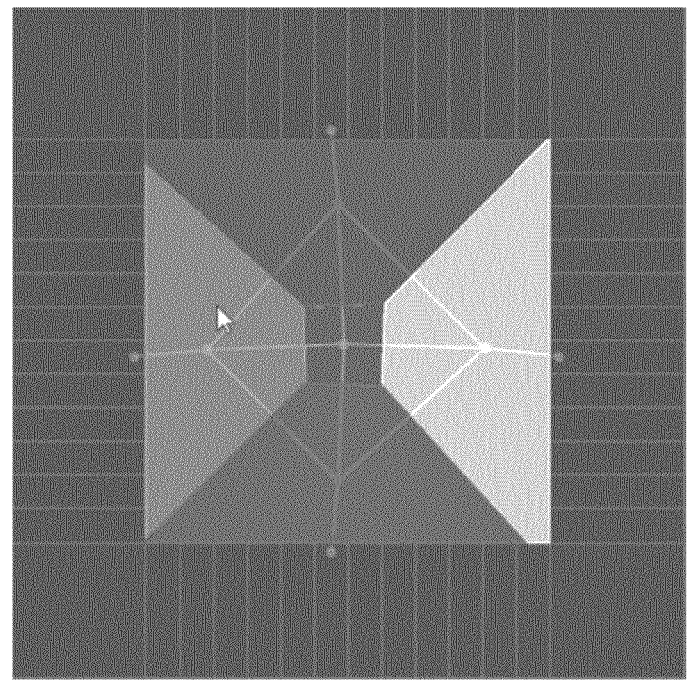
Figure 11I:
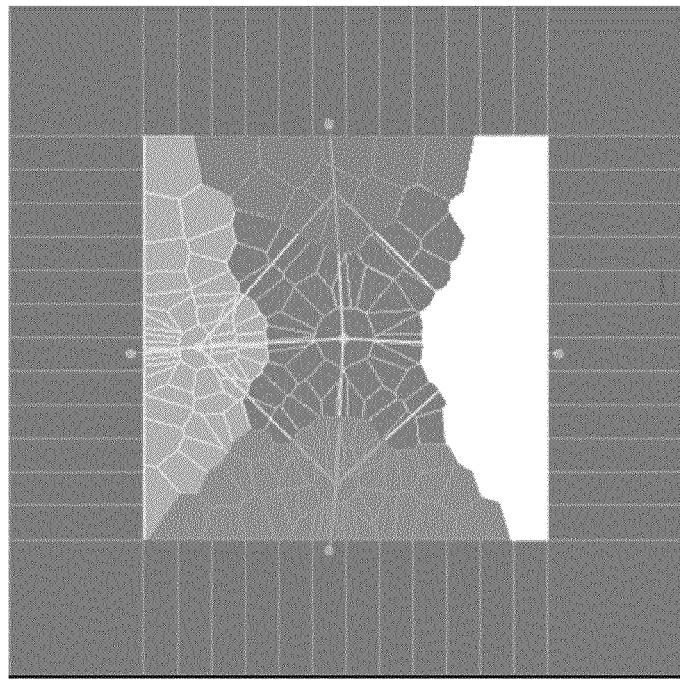
Figure 11J:
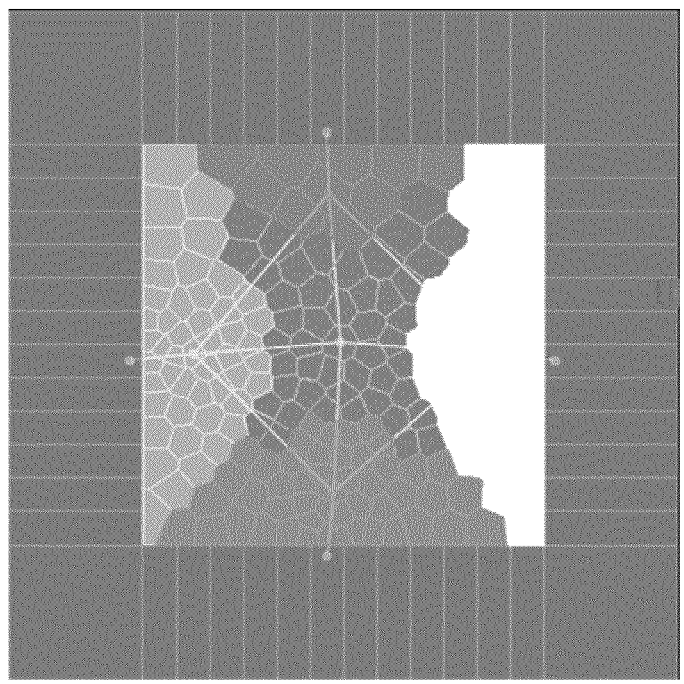
Figure 11K:
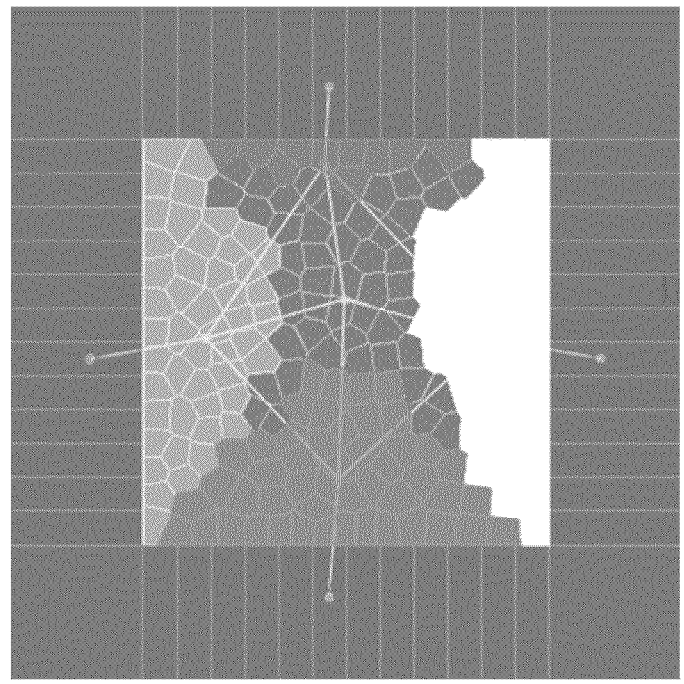
Figure 11L:
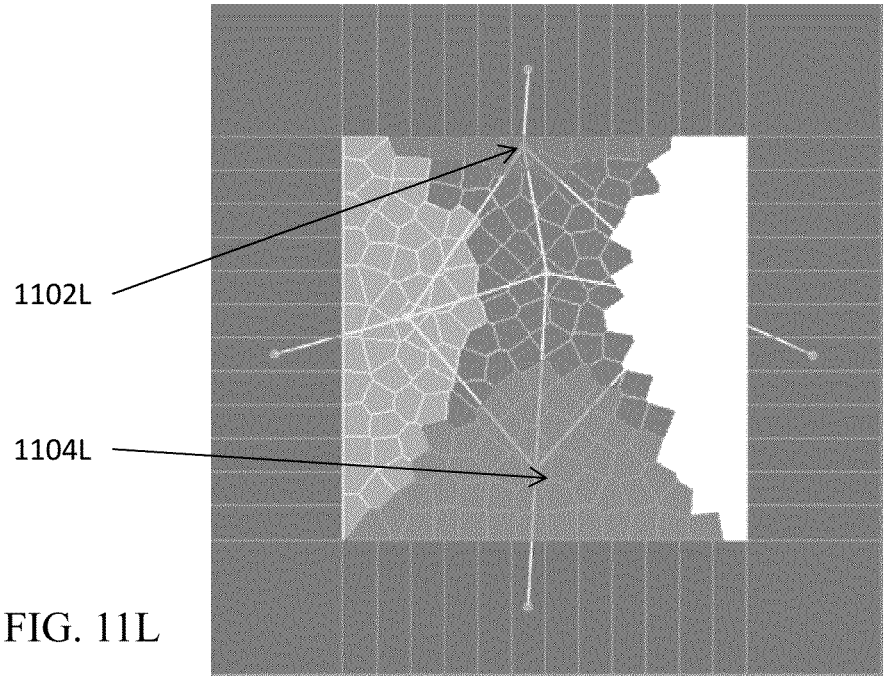
Figure 11M:
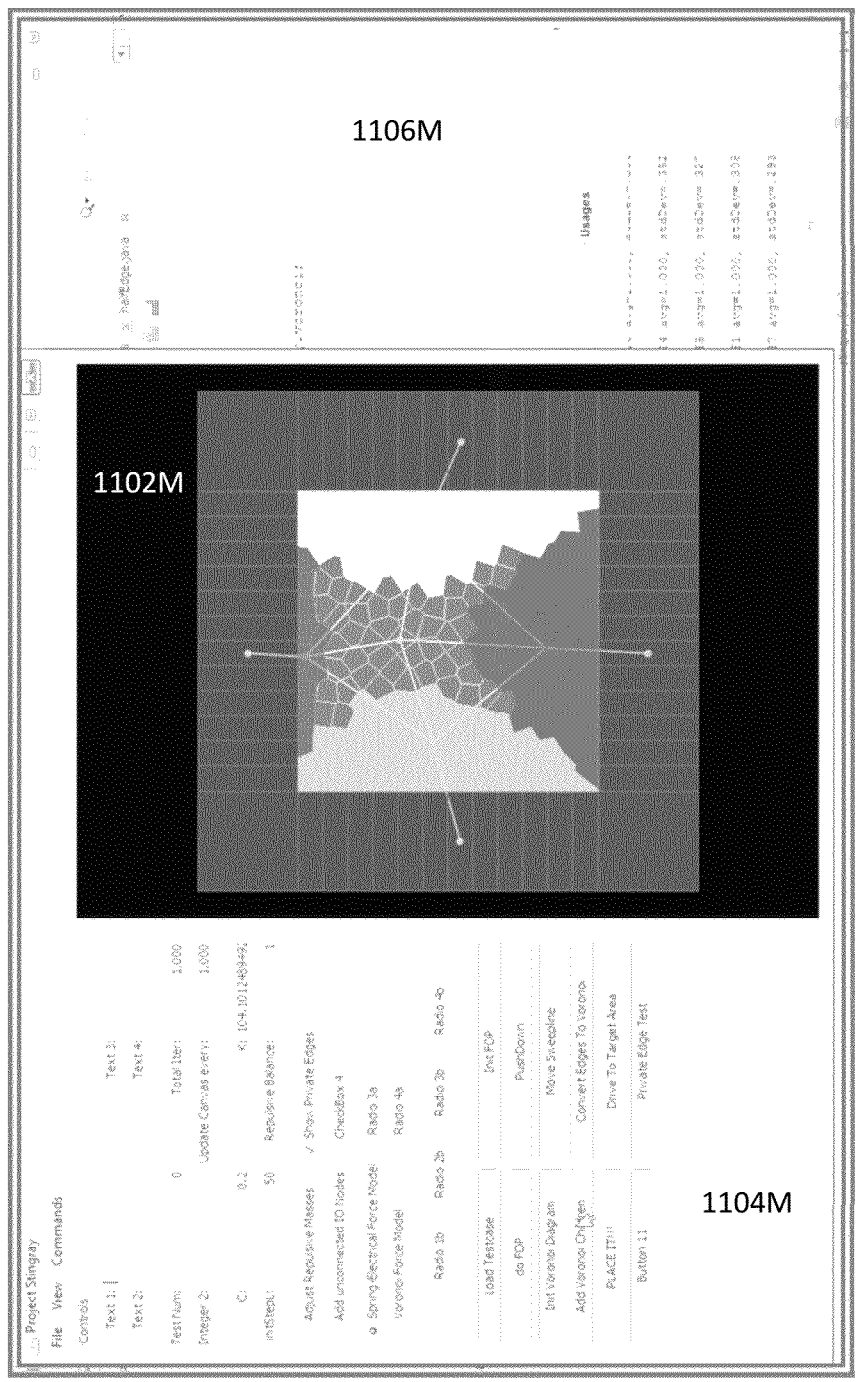
Figure 11N:
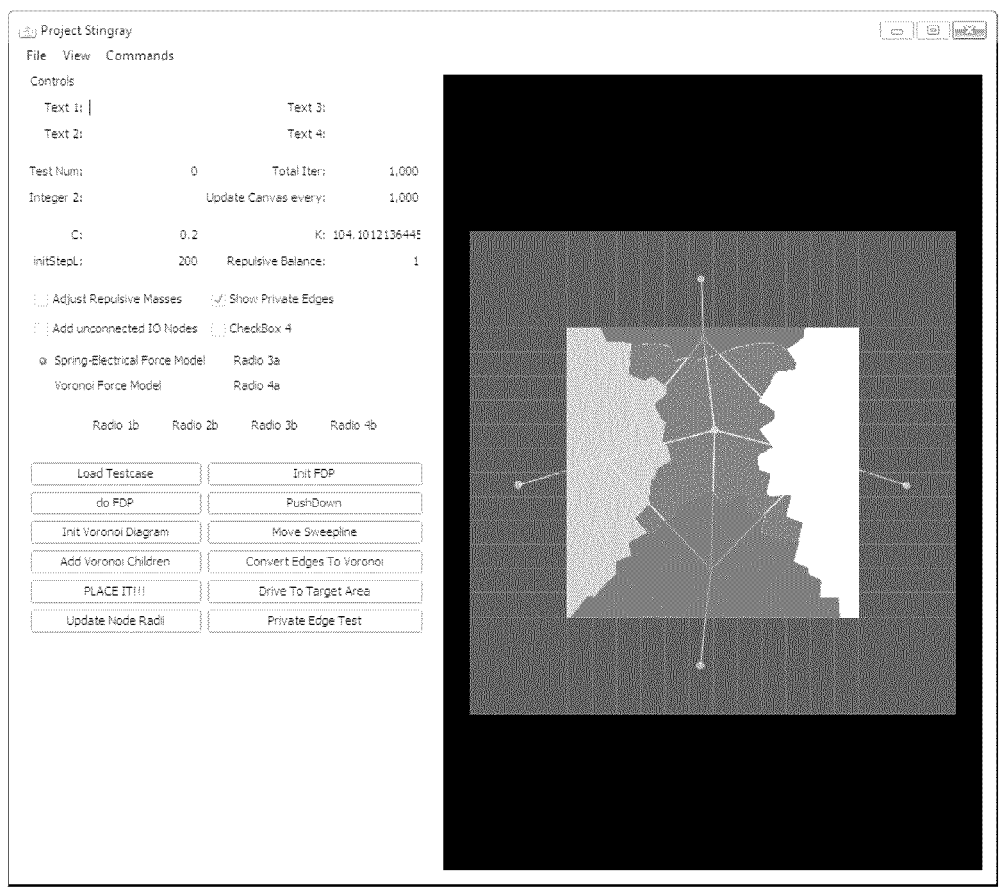

FIGS. 11A-N illustrate the generation of an exemplary floorplan or a placement layout during the implementation of the corresponding physical design using one or more force models operating on sets of cells representing the a physical design space of the physical design in some embodiments. More specifically, FIG. 11A-N illustrate a sequence of animated screen shots of a graphical display area showing a floorplan or a placement layout captured during the generation of the floorplan or the placement layout of an exemplary electronic design. FIG. 11A illustrates an electronic design with a core area 1108A and an IO area 1106A. The electronic design is associated with custom conductivity information (e.g., user-specified conductivity) that requires that node 1102A communicate with four other nodes (1104A) in the IO area 1106A. Moreover, FIG. 11A illustrates the design is subject to a custom conductivity (e.g., user specified conductivity) that connects node 1102A to the four nodes (1104A, 4×) in the IO area 1106A.

FIGS. 11B-D shows how the nodes (e.g., 1102D in FIG. 11D) are continuously moved by using one or more force models described herein until one or more criteria (e.g., a minimum potential energy level) are satisfied. It shall be noted that the conductivity is maintained during the performance of the force directed placement or floorplanning process. In addition, the core area (e.g., 1108A in FIG. 11A) has not been partitioned in FIG. 11A-D; therefore, some embodiments may use, for example, the spring attractive force model and the electrical repulsive force model together with the containment force model to drive the nodes (e.g., 1102D in FIG. 11D) while maintaining the custom conductivity.

FIGS. 11E-H illustrate the generation of the Voronoi cells by using the five nodes (1102D in FIGS. 11D and 1102A in FIG. 11A). FIGS. 11E-H further illustrate the four nodes in the cells, for example, 1102G, 1106G, 1108G, and 1110G are moved as the Voronoi cells are generated by using some force models that are determined based at least in part upon certain cell characteristics (e.g., cell-based attractive force model, etc.) The generation of the Voronoi cells may cause changes in some force models that are determined based at least in part upon some cell characteristics. Such changes in those force models may further move the five Voronoi generation nodes and thus in turn cause changes in the generated Voronoi cells. As described above, various embodiments iteratively apply one or more force models and the Voronoi decomposition models until one or more convergence criteria are satisfied. It shall be noted that the one or more convergence or stopping criteria do not include the target area criterion in FIGS. 11A-G, and thus the five cells exhibit different sizes.

FIGS. 11I-L illustrates decomposing a larger Voronoi cell into a plurality of smaller Voronoi cells where each of the five larger Voronoi cells (e.g., 1102G, 1106G, 1108G, and 1110G) is further represented by a plurality of Voronoi cells. It shall be noted that FIGS. 11K-L illustrate the result of applying the size constraint that requires the area of region 1102L be approximately one-fifth (⅕) of any of the other four regions. As it may be seen from FIG. 11K, approximately five times as many nodes are introduced in region 4104L than in region 1102L and iteratively performs the Voronoi decomposition with, for example, one or more force models described herein. FIGS. 11K-L illustrate the final Voronoi decomposition of the core area in which region 1102L has approximately one-fifth (⅕) the size of region 1104L. It shall be noted that the conductivity, as specified in FIG. 11A, is nonetheless maintained throughout the entire process from FIG. 11A to FIG. 11L.

FIGS. 11M-N illustrate an exemplary user interface with a design window 1102M showing the finished physical implementation shown in FIG. 11L. The content of window 1102M is continuously refreshed to reflect the nodal locations, the generated floorplan or placement layout, and the custom conductivity in some embodiments. In some embodiments, the user interface may provide visual, textual, or both visual and textual representation of the state of the physical implementation in substantially real-time. It shall be noted that the term substantially is used to reflect the fact that every computation requires some time to complete, and that rendering the computational result also requires some time to complete, regardless of how fast the computing system performing these tasks is. The window 1102M may also show or hide the boundaries of individual Voronoi cells in some embodiments. The user interface may provide the user with the capability of showing various types of design related information in various forms depending on the user's input in some embodiments.

For example, the user interface may provide configurable information of a cell (e.g., cell area, deviation from target, conductivity, etc.) when the user manipulates an input device (e.g., a pointing device) to hover around the cell. As another example, the user interface may show, depending on the user's choice in configurations or settings, which cells are deviating more from the one or more convergence criteria in some embodiments. In some embodiments, the user interface may, depending on the user's choice in configurations or settings, use multiple different colors or a thermal map to indicate which portions of the design exhibit higher errors, and which portions exhibit lower errors.

The user interface may further include a control panel 1104M that provides various controls to a user. For example, the control panel 1104M may allow a user to identify one or more cells or one or more nodes thereof and to modify (e.g., add, remove, change, infer, anchor, etc.) conductivity for the identified cells or nodes, to modify (e.g., add, remove, group, anchor, etc.) the nodes or cells, or to adjust various parameters, coefficients, constants, etc. in, for example, one or more force models or the decomposition algorithm in some embodiments. The control panel 1104M may also provide the user with the capability to specify, identify, or determine one or more convergence or stopping criteria in some embodiments.

The control panel may also provide context-based hints, recommendations, or help to the user depending on what the system is performing at a given instant, on what the user inputs into the system, or on receiving a request by the user in some embodiments. The user interface may also provide a separate display area 1106M to show various types of more detailed information such as but not limited to the geometric information, errors, or any other information of a cell, a node, etc. of the design in the window 1102M. FIG. 11N illustrates the same final floorplan or placement layout as FIG. 11M, but the boundaries of individual Voronoi cells have been suppressed.

Figure 12A:
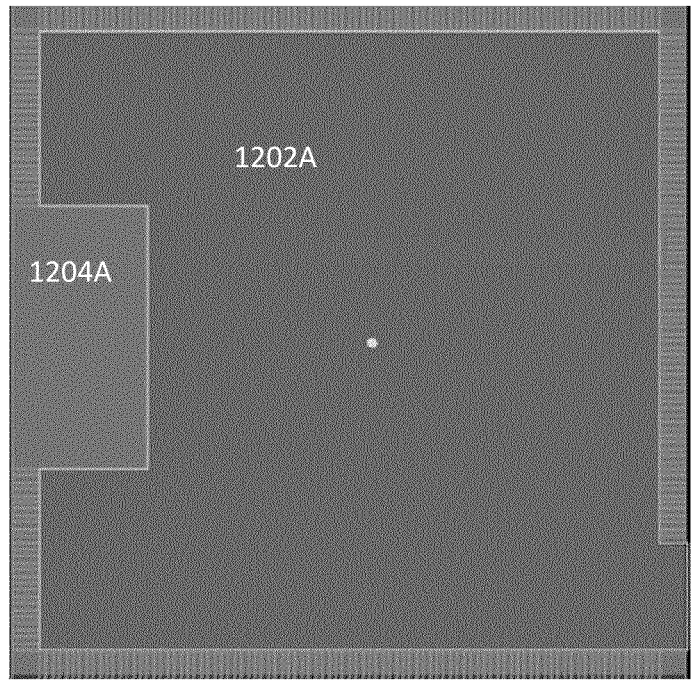
FIGS. 12A-P illustrate how the exemplary physical design decomposition evolves using the some of the processes described herein in some embodiments.
Figure 12B:
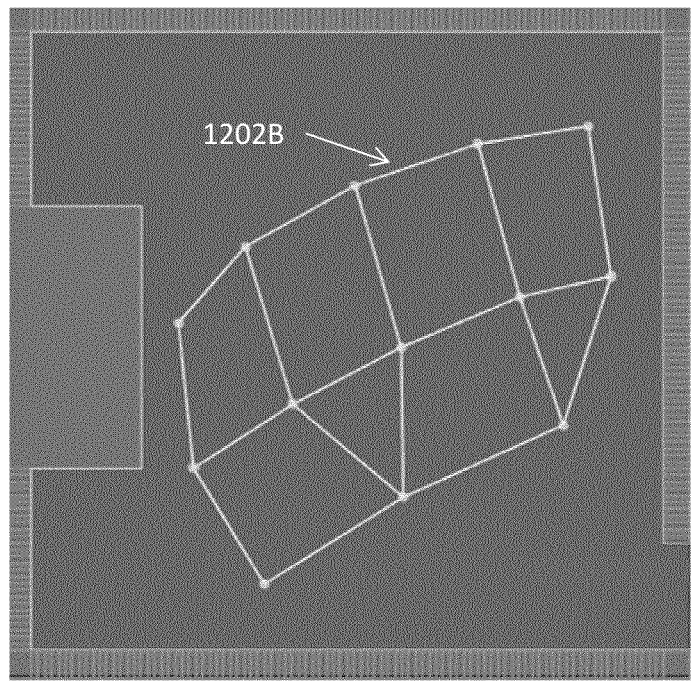
Figure 12C:
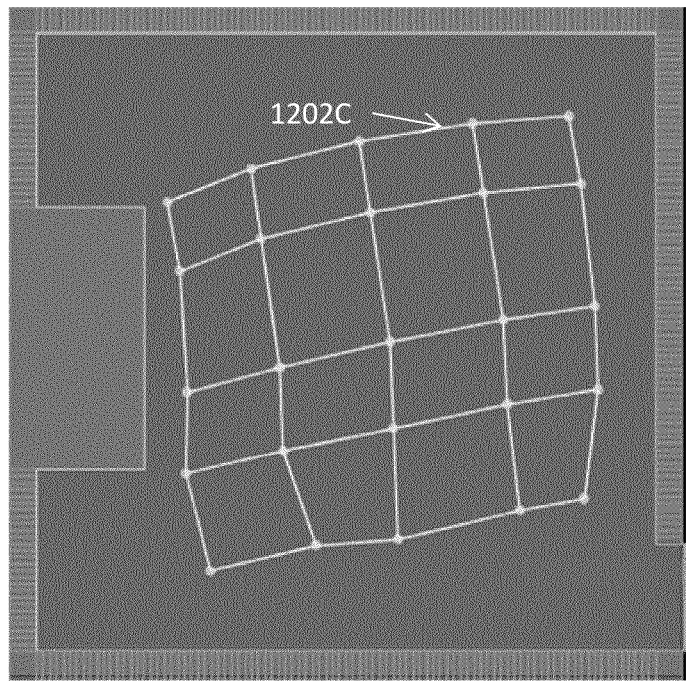
Figure 12D:
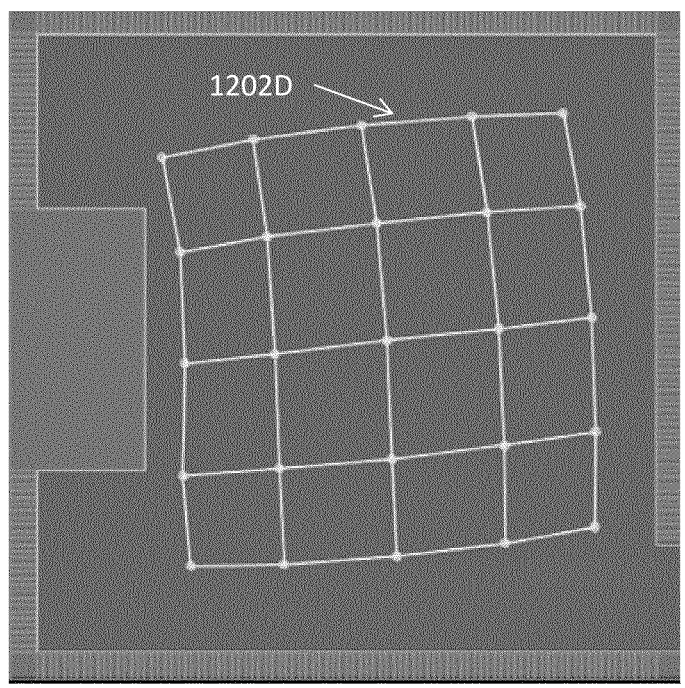
Figure 12E:
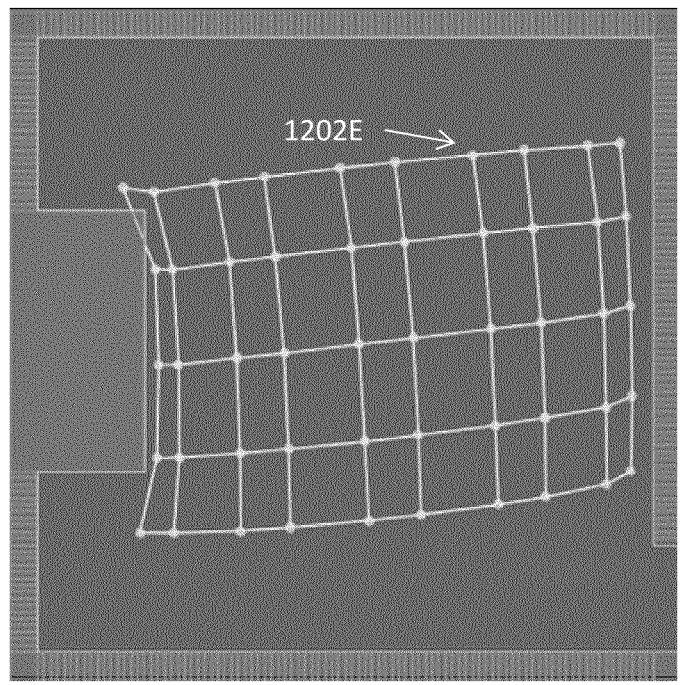
Figure 12F:
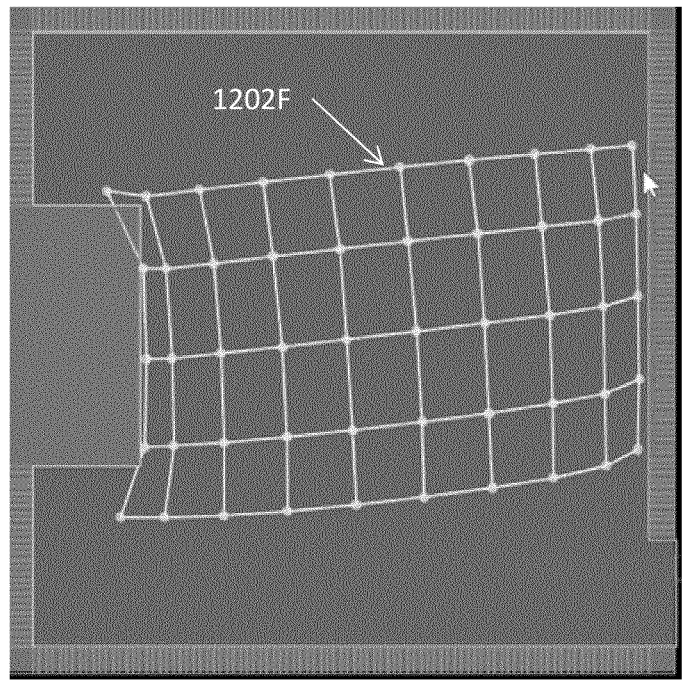
Figure 12G:
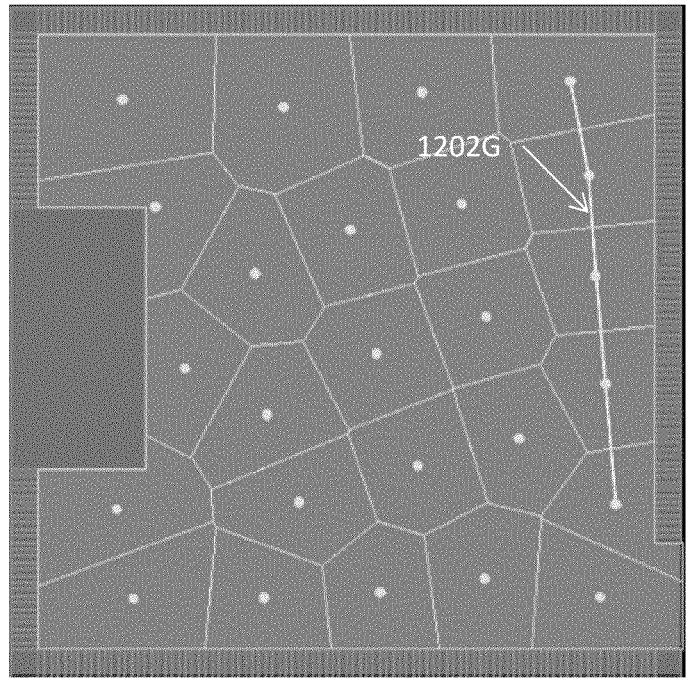
Figure 12H:
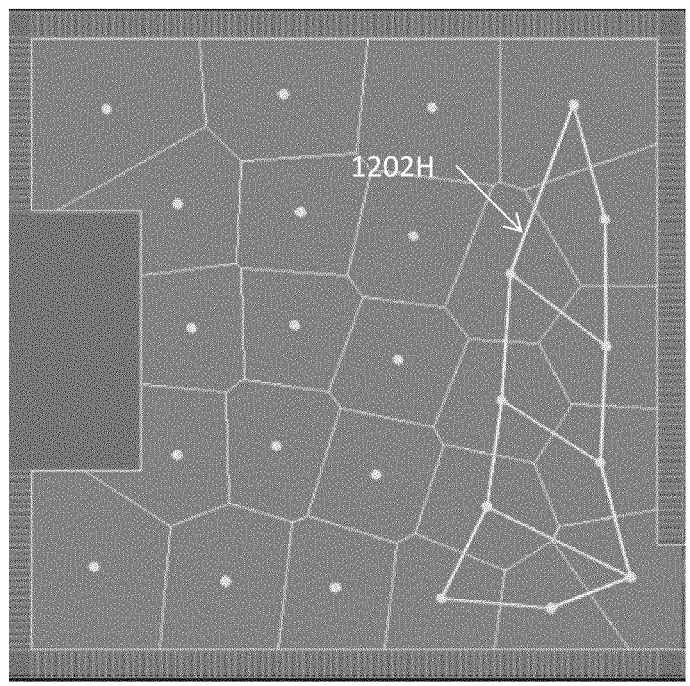
Figure 12I:
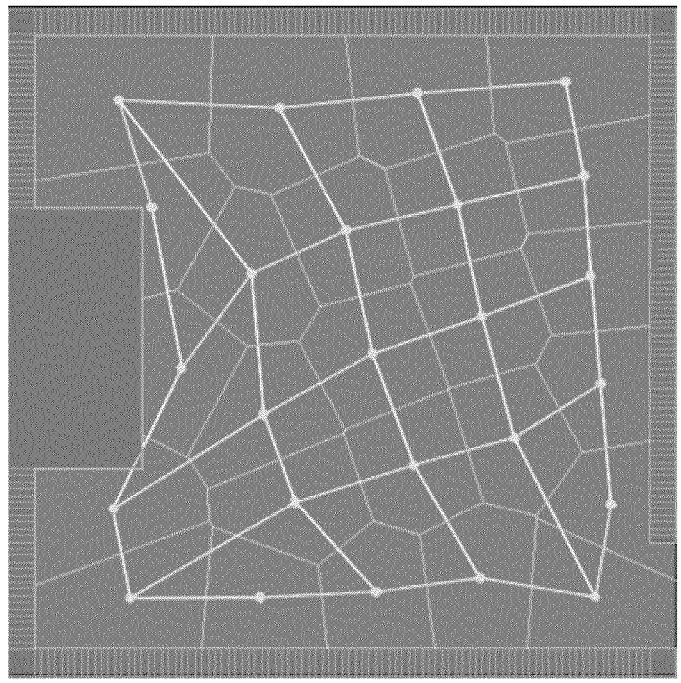
Figure 12J:
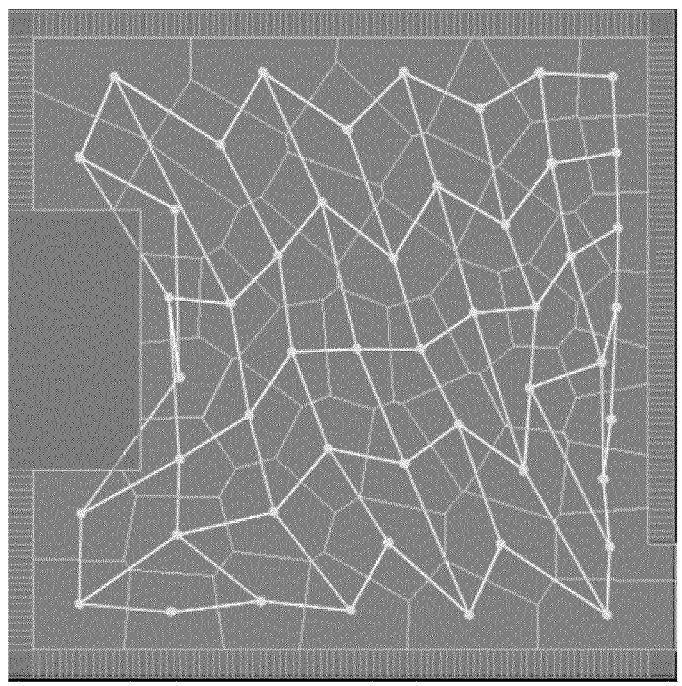
Figure 12K:
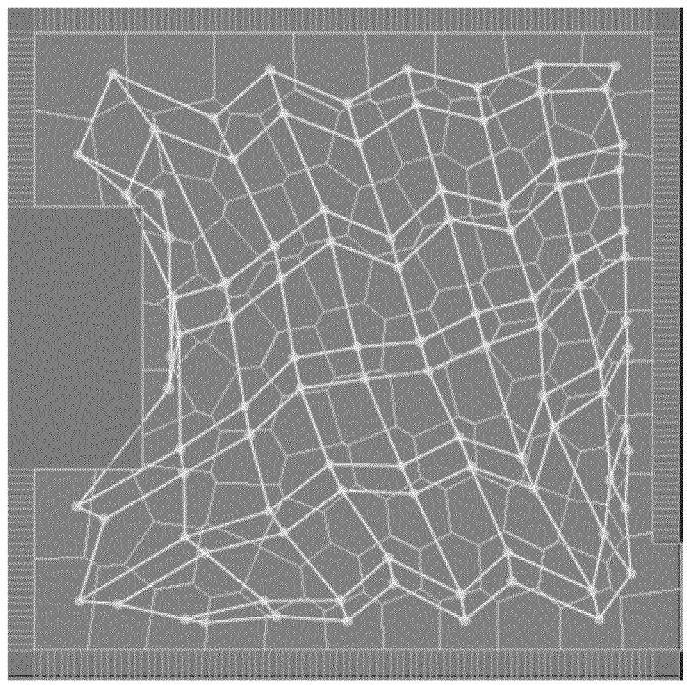
Figure 12L:
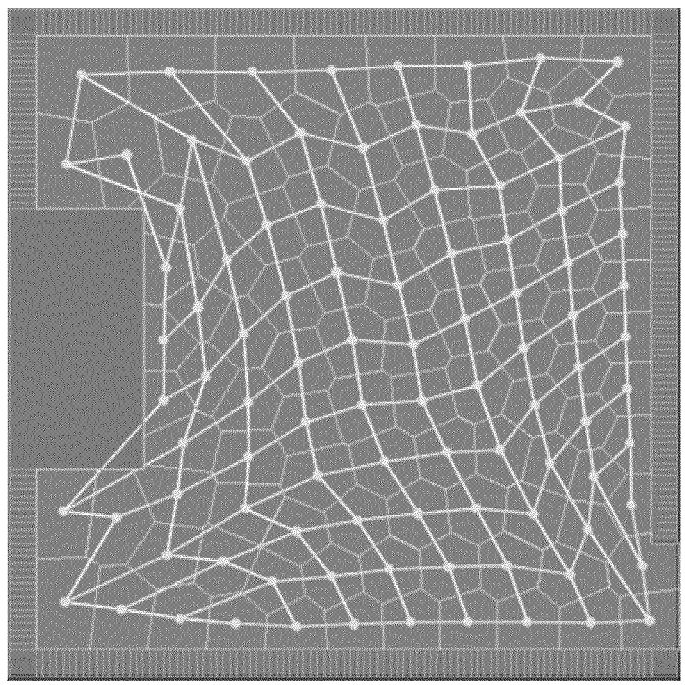
Figure 12M:
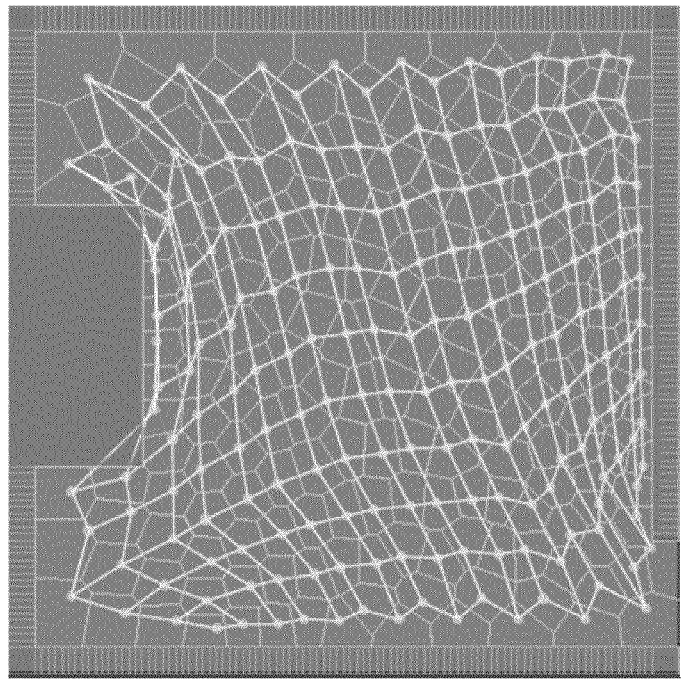
Figure 12N:
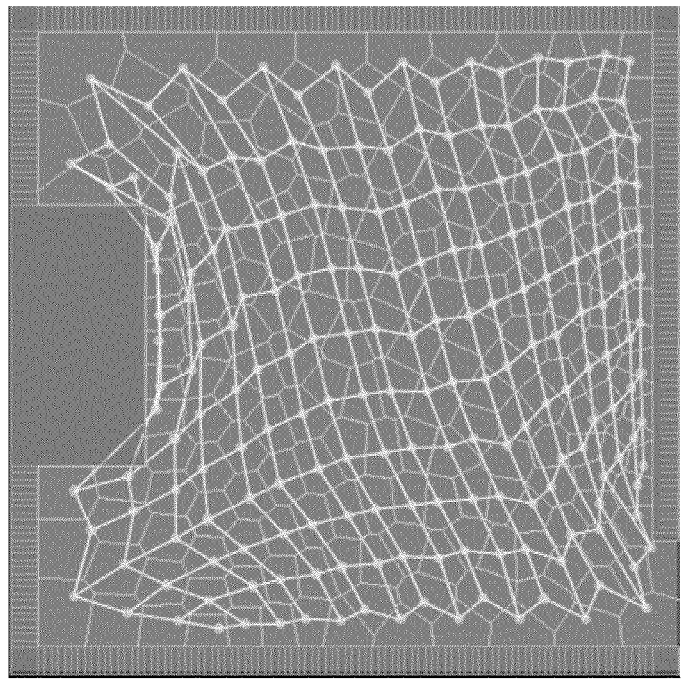
Figure 12O:
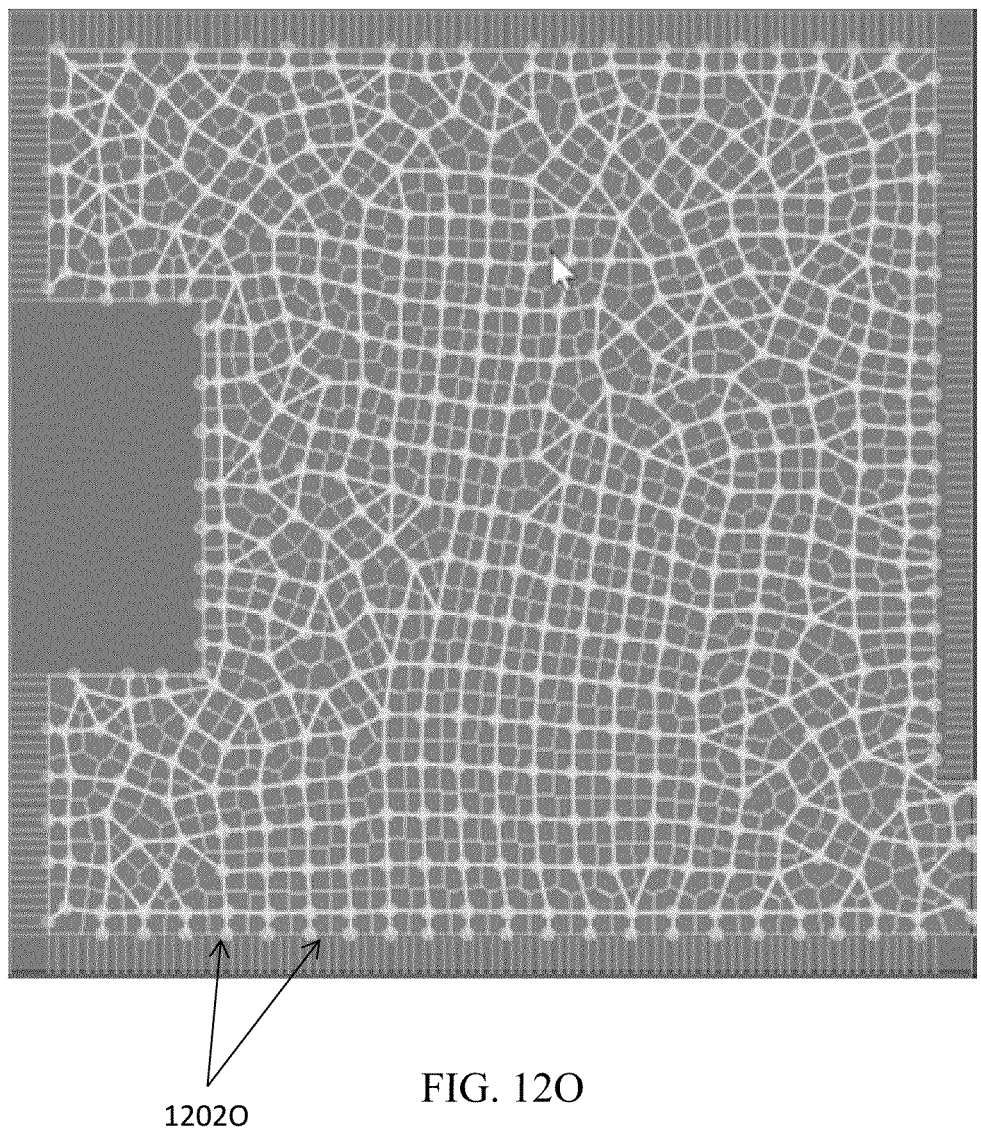
Figure 12P:
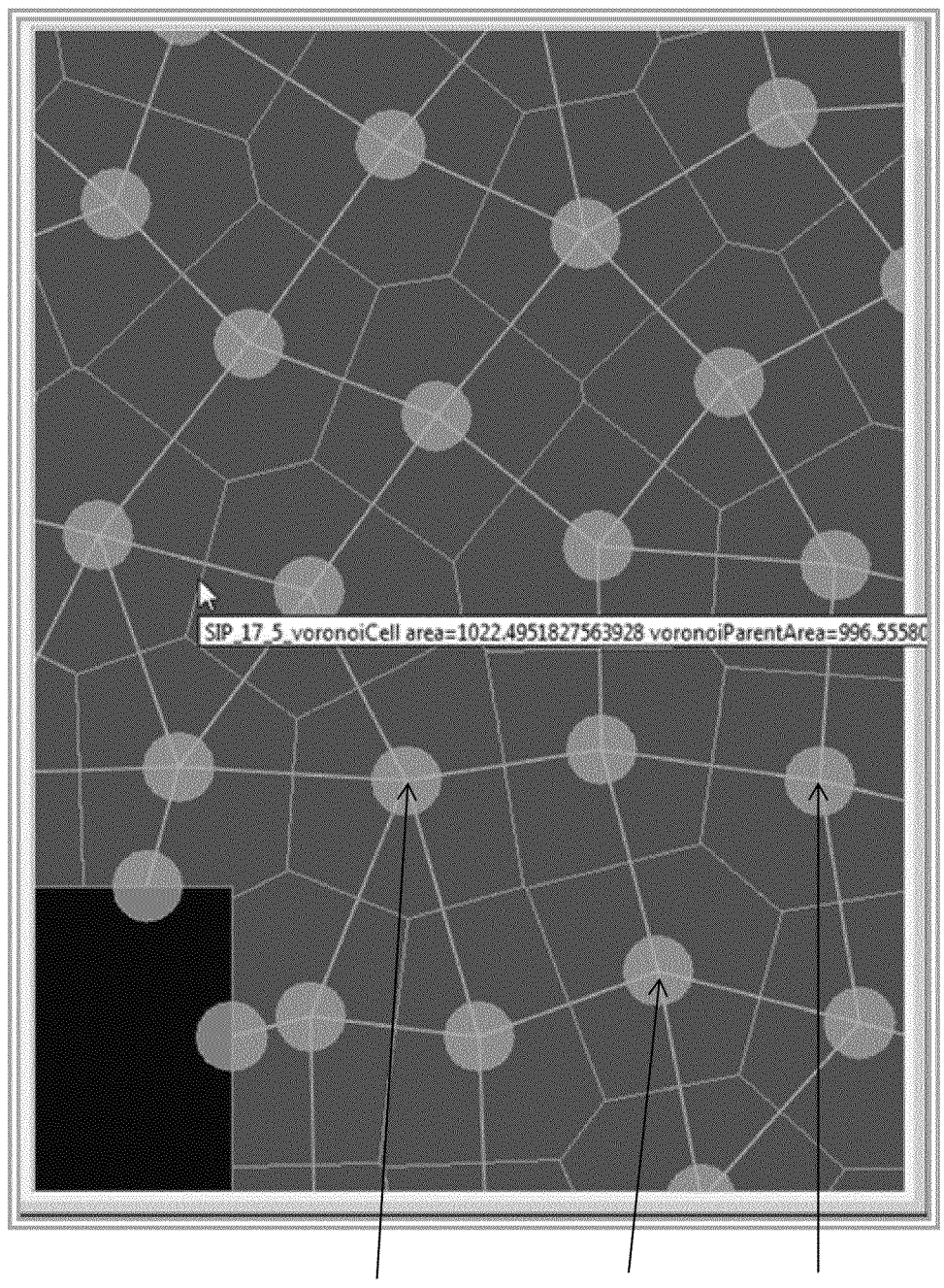

FIGS. 12A-P illustrate how the exemplary physical design decomposition evolves using the some of the processes described herein in some embodiments. More specifically, FIG. 12A-P illustrate a sequence of animated screen shots of a graphical display area showing a floorplan or a placement layout captured during the generation of the floorplan or the placement layout of an exemplary electronic design. Moreover, FIGS. 12A-B illustrates the initial physical design space including the core area 1202A and the IO area 1204A that substantially surrounds the core area 1202A. 1202B represents the 13 Voronoi generation nodes that are associated with certain conductivity and will be used to decompose the core area. FIGS. 12C-D illustrate how the initial grids gradually evolve into a 5×5 grid (1202C in FIGS. 12C and 1202D in FIG. 12D) at a lower hierarchical level by pushing down from the higher hierarchical level of FIGS. 12A-B to the lower hierarchical level of FIGS. 12C-D. It shall be noted that although several grids are illustrated in this example, these illustrated grids are not indicative of any requirement for a design to reflect a grid structure in the conductivity.

FIGS. 12E-F shows the continuous evolution of the decomposition of the core area by pushing down to another lower hierarchical level having the 9×4 grid (1202E and 1202F). FIGS. 12G-H illustrate the evolving Voronoi decomposition of the core area where the Voronoi cells are driven to a target area, and the edges 1202G and 1202H respectively represent the conductivity (e.g., user specified conductivity) and the reconfigured conductivity in which the nodes exhibit degrees of 2 or 3 in 1202H.

FIGS. 12I-J illustrate the intermediate versions of the layout with the nodes of the Voronoi cells and how the Voronoi cells continue to change by moving the nodes (e.g., by using a force directed placement model). These two figures further illustrate that the initial, user-specified conductivity collapsed during the initial Voronoi decomposition into multiple hierarchical levels. In these embodiments, the term "collapse" indicates the process of iteratively reducing a graph having multiple nodes and some connectivity into multiple hierarchical levels by at least merging or collapsing edges that connect nodes that may be grouped at the next higher hierarchical level in some embodiments. In some of these embodiments, the nodes on both ends of an edge are merged into a single parent node when the edge collapses. In some other embodiments, nodes that share some characteristics that indicate it may be needed or desirable to physically group these nodes but do not necessarily connected by an edge may also be merged into a single parent node at a higher hierarchical level. In some embodiments, these characteristics may include, for example but not limited to, the presence of certain nodes in the same module of a logical design hierarchy, or the connection to the same clock domain, etc. FIGS. 12K-N illustrates further pushing down to even lower hierarchical levels, moving the nodes of the Voronoi cells, re-performing the Voronoi decomposition based on the moved nodes, and inferring or reconfiguring the conductivity among the Voronoi cells.

FIG. 12O illustrates the final Voronoi decomposition of the core area. FIG. 12O further illustrates anchoring (1202O) some Voronoi cells at the edges of the core area to some IO cells in the IO area. In the example illustrated in FIG. 12P, node 1202P exhibits a degree of five if all conductivity is to be considered. The method may reconfigure the conductivity for the cell corresponding to node 1202P to have the uniform degree of four by substantially uniformly distributing the degree in the angular direction around node 1202P. As a result of reconfiguring the conductivity, node 1202P is exhibiting a degree of four where the conductivity between node 1202P and node 1204P is not present. It shall be noted that it is optional to reconfiguring the conductivity, and thus FIG. 12P still shows that some nodes (e.g., node 1206P showing a degree of five) are still exhibiting some non-uniform degree(s).

Figure 13A:
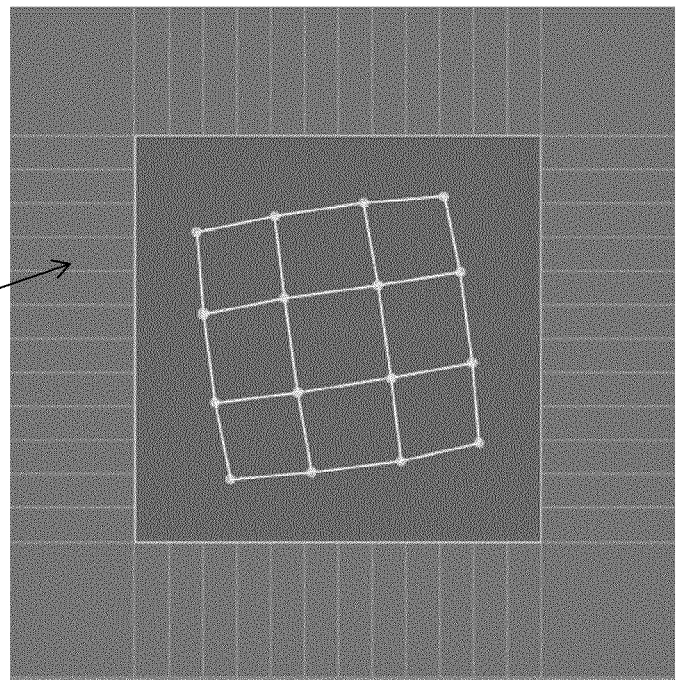
FIGS. 13A-E illustrate the generation of another exemplary floorplan or a placement layout during the implementation of the corresponding physical design using one or more force models operating on sets of cells representing the a physical design space of the physical design in some embodiments.
Figure 13B:
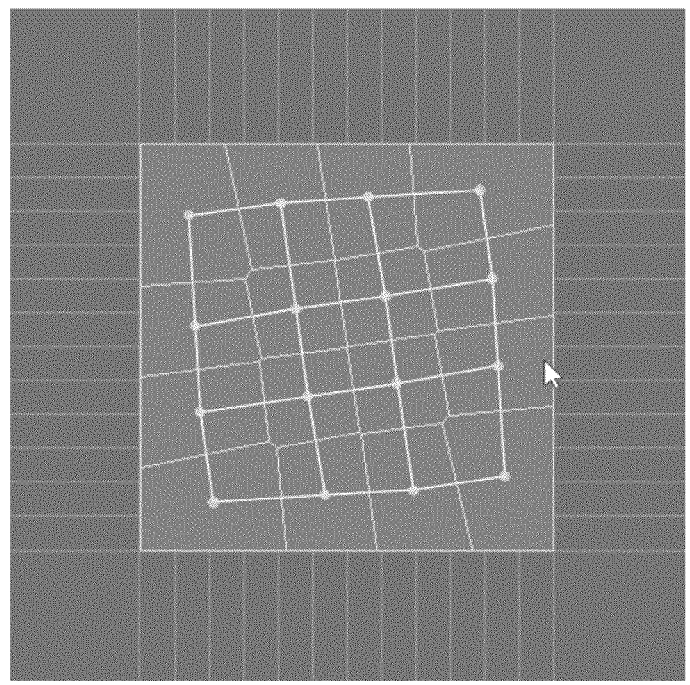
Figure 13C:
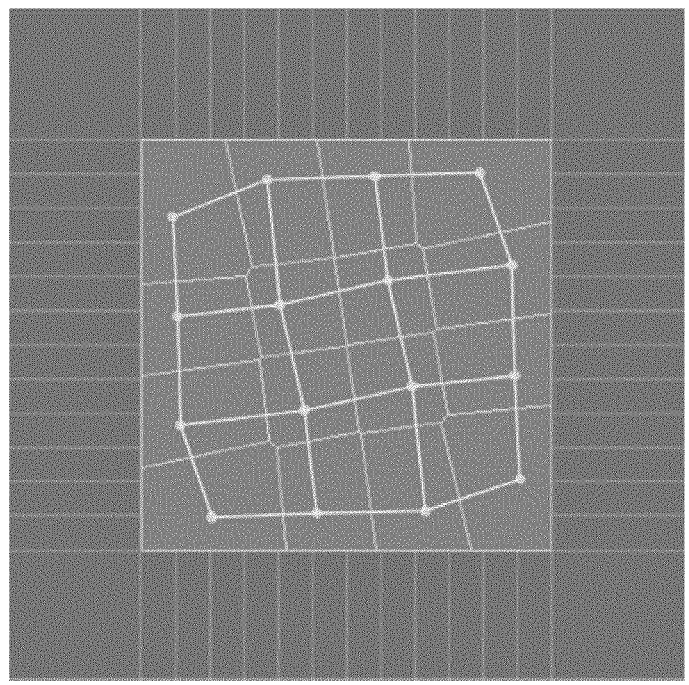
Figure 13D:
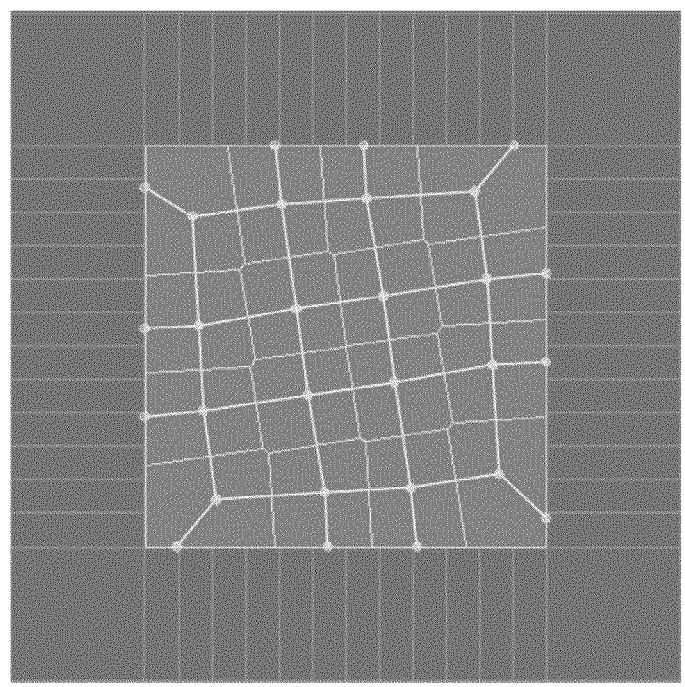
Figure 13E:
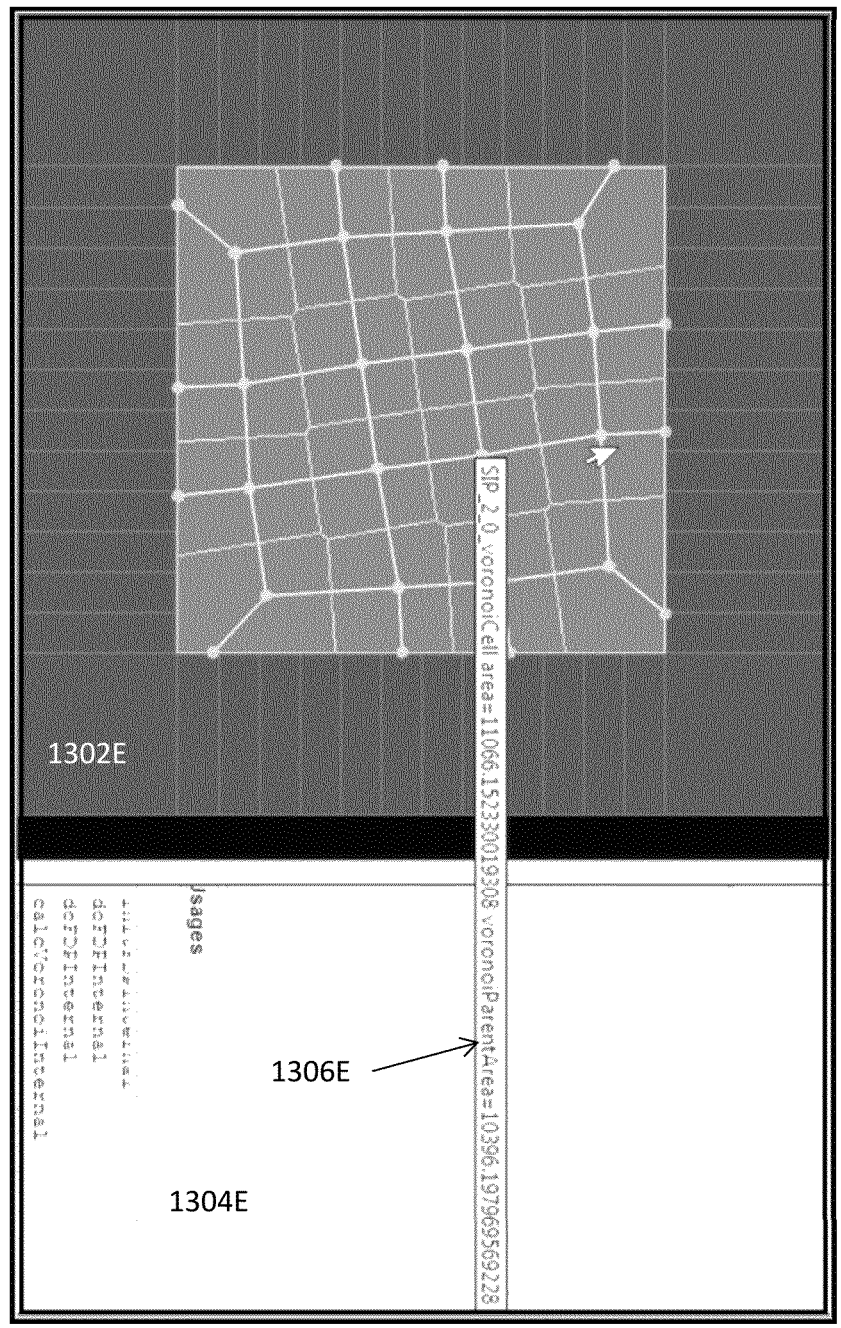

FIGS. 13A-E illustrate the generation of another exemplary floorplan or a placement layout during the implementation of the corresponding physical design using one or more force models operating on sets of cells representing the a physical design space of the physical design in some embodiments. More specifically, FIG. 13A-D illustrate a sequence of animated screen shots of a graphical display area showing a floorplan or a placement layout captured during the generation of the floorplan or the placement layout of an exemplary electronic design. It shall be noted that FIGS. 13A-D merely represent four frames captured from the animation of the generation process for the floorplan or placement layout, and that the actual presentation of the generation process may include much more frames to provide a smoother animated sequence throughout the entire generation process. Moreover, some embodiments present the nodes used by one or more force models. Some other embodiments present interpolated nodes in the graphical display area, rather than the nodes actually used by the one or more force models. In these latter embodiments, the method or the UI animation code may determine a list of initial node locations and a list of locations to which each node is to move. The method or the UI animation code may optionally determine one or more interpolated nodal locations between the initial node location and its corresponding destination based at least in part upon how smooth the animation of is to be. For example, if a node needs to move a fairly long distance, and it is desired to have a smoother animation of how the cells morph, the method may determine more interpolated node locations between the initial location and the corresponding destination. The method or the UI code may then illustrate these interpolated node locations in an animated sequence. As another example, if a node only needs to travel a fairly short distance, or if the smoothness of the animation is not needed or desired, then the method may determine fewer interpolated node locations or no interpolated node locations at all for the UI code to present in the graphical display area. FIG. 13A illustrates the graph layout of a 4×4 grid having 16 nodes. FIG. 13B illustrates the generated Voronoi cells based on the 16 Voronoi generation nodes. It shall be noted that neither the vertices in either the graph layout of FIG. 13A nor the nodes in FIG. 13B are connected to any of the IO cells (e.g., 1302A.)

FIGS. 13C-D illustrates the iterative operations of the force model(s) on the nodes to move the nodes to locations where one or more convergence or stopping criteria (e.g., a target area criterion or a minimum or reduced energy level, etc.) are satisfied. FIG. 13D further illustrates anchoring the cells at the edges of the core area to the corresponding IO cells in the IO area. FIG. 13E illustrates a part of an exemplary user interface with a graphic display portion 1302E showing the state of the physical implementation of a design, a textual display portion 1304E showing more detailed design related information, and a context-based, brief summary of some design related information based on the user's input or manipulation of the design or of the input device. FIG. 13E further shows a context-based display of design related information. In this exemplary implementation, FIG. 13E shows a brief summary of information of the cell when a user manipulates the pointing device so the pointing cursor hovers over the cell in the design. In some embodiments, a user may configure what information is to be shown as the context-based design related information in one or more specific contexts.

Figure 14A:
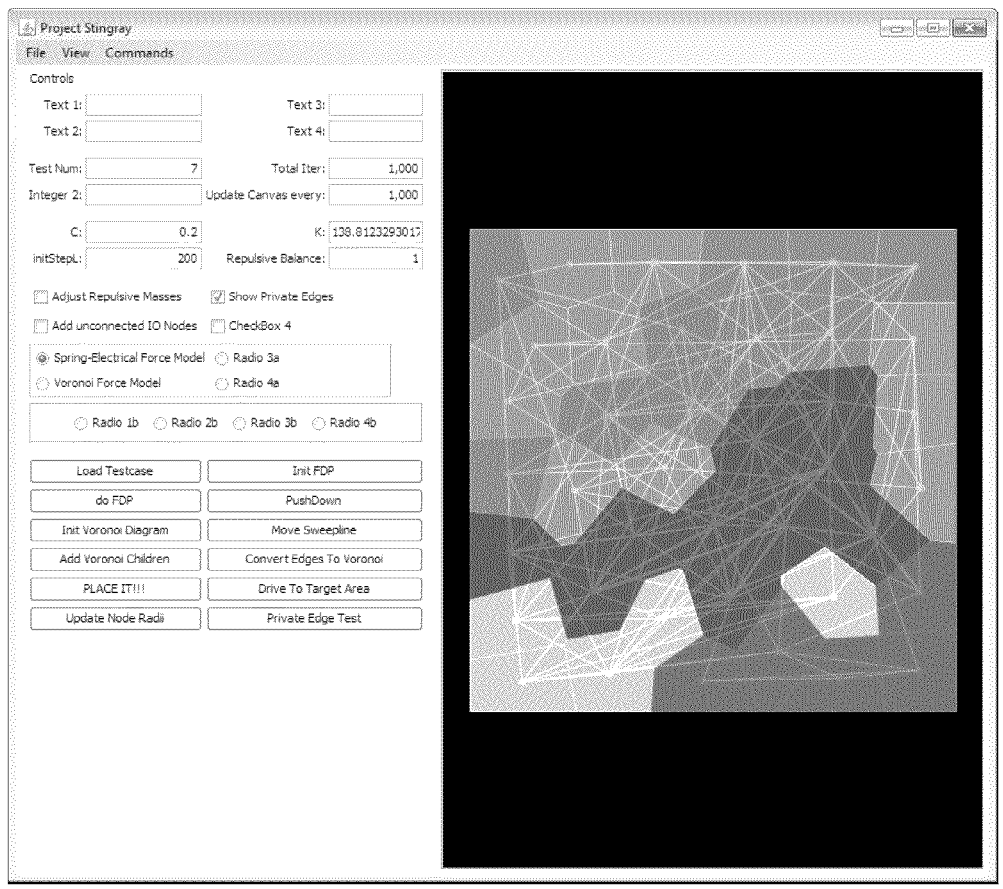
FIGS. 14A-B illustrate the generation of another exemplary floorplan or a placement layout during the implementation of the corresponding physical design using one or more force models operating on sets of cells representing the a physical design space of the physical design in some embodiments.
Figure 14B:
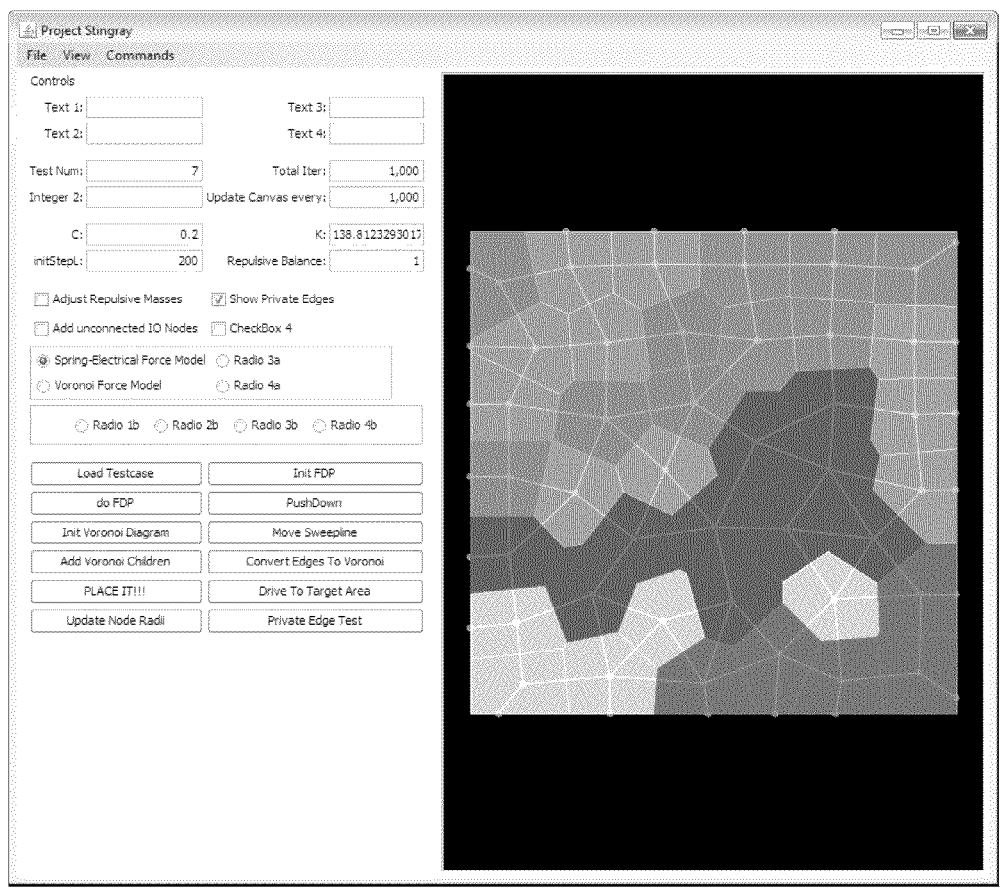

FIG. 14A illustrates a part of an exemplary user interface showing a set of mostly randomly interconnected nodes. That is, the conductivity (e.g., user-specified conductivity shown in FIG. 14A comprises random conductivity. FIG. 14B shows the final floorplan or placement layout of the same after applying various processes described herein to the initial set of nodes in FIG. 14A. Moreover, FIG. 14B further illustrates inferred conductivity and anchoring the cells bordering the edges of the core area.

System Architecture Overview

Figure 15:
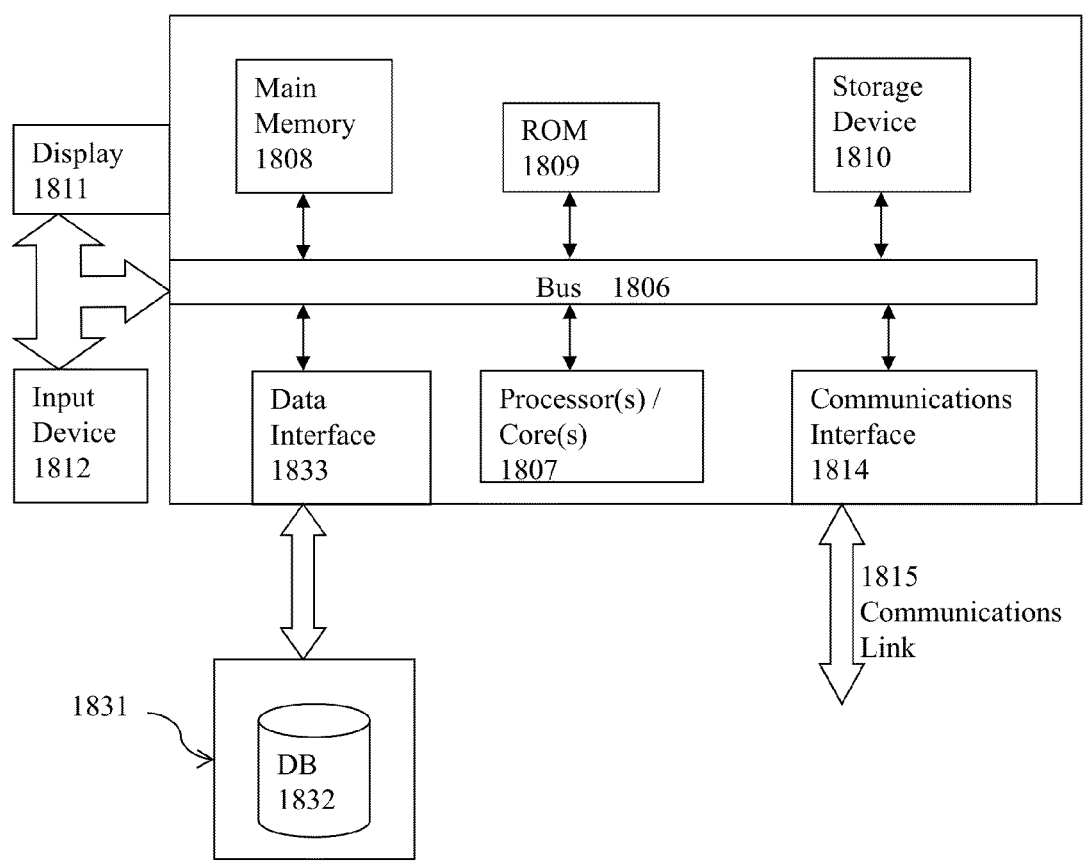
FIG. 15 illustrates a block diagram of an illustrative computing system 1400 suitable for implementing various embodiments described here.

FIG. 15 illustrates a block diagram of an illustrative computing system 1800 suitable for implementing various embodiment of the invention. For example, the exemplary computing system 1800 may be used to implement various processes as described in the preceding paragraphs and the figures such as various processes or modules of determining whether the first post is of interest, various analysis processes or modules, various other determining processes or modules, various processes or modules for performing various actions, etc. as described in the remainder of the Application. Computer system 1800 includes a bus 1806 or other communication mechanism for communicating information, which interconnects subsystems and devices, such as processor 1807, system memory 1808 (e.g., RAM), static storage device 1809 (e.g., ROM), disk drive 1810 (e.g., magnetic or optical), communication interface 1814 (e.g., modem or Ethernet card), display 1811 (e.g., CRT or LCD), input device 1812 (e.g., keyboard), and cursor control (not shown).

According to one embodiment of the invention, computer system 1800 performs specific operations by one or more processors or processor cores 1807 executing one or more sequences of one or more instructions contained in system memory 1808. Such instructions may be read into system memory 1808 from another computer readable/usable storage medium, such as static storage device 1809 or disk drive 1810. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention. In the single embodiment or in some embodiments, the one or more processors or processor cores 1807 may be used to perform various actions such as various actions, processes, or modules involving determining, analyzing, performing actions, etc. In some embodiments, at least one of the one or more processors or processor cores 1807 has the multithreading capability.

In one embodiment, the term "logic" shall mean any combination of software or hardware that is used to implement all or part of the invention. In the single embodiment or in some embodiments, the one or more processors or processor cores 1807 may be used to perform various acts such as various acts involving determining, analyzing, performing actions, etc. In some embodiments, at least one of the one or more processors or processor cores 1807 has the multithreading capability to execute a plurality of threads to perform various tasks as described in the preceding sections.

Various actions as described in the preceding paragraphs may be performed by using one or more processors, one or more processor cores, or combination thereof 1807. For example, various processes or modules involving the determining action, various analysis processes or modules, etc. may be performed by one or more processors, one or more processor cores, or combination thereof.

The term "computer readable storage medium" or "computer usable storage medium" as used herein refers to any non-transitory medium that participates in providing instructions to processor 1807 for execution. Such a medium may take many forms, including but not limited to, non-volatile media and volatile media. Non-volatile media includes, for example, optical or magnetic disks, such as disk drive 1810. Volatile media includes dynamic memory, such as system memory 1808.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), a magnetic tape, any other magnetic or a magneto-optical medium, CD-ROM, any other optical medium, punch cards, paper tape, any other physical medium with patterns of holes, RAM, PROM, EPROM, FLASH-EPROM, any other memory chip or cartridge, or any other medium from which a computer can read. For example, the various forms of computer readable storage media may be used by the methods or the systems to store either temporarily or permanently information or data such as the one or more master regions, one or more master output layers, one or more global scratch layers, various transforms and inverse transforms, shapes, etc.

In an embodiment of the invention, execution of the sequences of instructions to practice the invention is performed by a single computer system 1800. According to other embodiments of the invention, two or more computer systems 1800 coupled by communication link 1815 (e.g., LAN, PTSN, or wireless network) may perform the sequence of instructions required to practice the invention in coordination with one another.

Computer system 1800 may transmit and receive messages, data, and instructions, including program, i.e., application code, through communication link 1815 and communication interface 1814. Received program code may be executed by processor 1807 as it is received, and/or stored in disk drive 1810, or other non-volatile storage for later execution. In an embodiment, the computer system 1800 operates in conjunction with a data storage system 1861, e.g., a data storage system 1861 that contains a database 1862 that is readily accessible by the computer system 1800. The computer system 1800 communicates with the data storage system 1861 through a data interface 1866. A data interface 1866, which is coupled to the bus 1806, transmits and receives electrical, electromagnetic or optical signals that include data streams representing various types of signal information, e.g., instructions, messages and data. In embodiments of the invention, the functions of the data interface 1866 may be performed by the communication interface 1814.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer implemented method for providing evolving information in generating a physical design with custom conductivity using force models and design space decomposition, comprising:
   at least one processor performing a process, the process comprising:
   presenting a physical design area of an electronic design in an interface;
   identifying or receiving an input for a physical design of the electronic design;
   identifying or receiving a request for creating the physical design of the electronic design; and
   displaying an evolution of the physical design in the interface to reflect temporal states of the physical design during generation of the physical design using the force models.

2. The computer implemented method of claim 1, in which the process further comprises:
   identifying or receiving a pause instruction to pause the generation of the physical design; and
   pausing the generation of the physical design in response to the pause instruction.

3. The computer implemented method of claim 2, in which the process further comprises:
   identifying or receiving a resume instruction to resume paused generation of the physical design; and
   resuming the generation of the physical design in response to the resume instruction.

4. The computer implemented method of claim 1, in which the process further comprises:
   identifying or receiving a rewind instruction to rewind the generation of the physical design to a prior time point or state; and
   restoring at least the physical design to a prior state corresponding to the prior time point or state in response to the rewind instruction.

5. The computer implemented method of claim 1, in which the process further comprises:
   identifying or receiving a fast forward instruction to rewind the generation of the physical design to a later time point or state; and
   restoring at least the physical design to a later state corresponding to the later time point or state in response to the fast forward instruction.

6. The computer implemented method of claim 1, in which the process further comprises:
   identifying or receiving an input for modifying the electronic design or the generation of the physical design during the generation of the physical design; and
   capturing the input for the generation of the physical design without exiting, terminating, or completing the generation of the physical design.

7. The computer implemented method of claim 6, in which the process further comprises:
   displaying an in-situ response of the physical design to the input during the generation of the physical design.

8. The computer implemented method of claim 1, in which the process further comprises:
   displaying context-based response in the interface based at least in part upon a user's manipulation of the electronic design or of the interface, wherein the process displays an animated illustration of the physical design in substantially real-time in a normal order or in a reverse order.

9. The computer implemented method of claim 1, in which the process further comprises:

identifying or receiving a control instruction for manipulating one or more force models, a decomposition process, or conductivity information during the generation of the physical design; and displaying an in-situ response of the physical design to the control instruction during the generation of the physical design.

10. An article of manufacture comprising a non-transitory computer readable storage medium storing thereupon a sequence of instructions which, when executed by at least one processor or at least one processor core, causes the at least one processor or the at least one processor core to perform a method for providing evolving information in generating a physical design with custom conductivity using force models and design space decomposition, the method comprising:

at least one processor performing a process, the process comprising:

presenting a physical design area of an electronic design in an interface;

identifying or receiving an input for a physical design of the electronic design;

identifying or receiving a request for creating the physical design of the electronic design; and displaying an evolution of the physical design in the interface to reflect temporal states of the physical design during generation of the physical design using the force models.

11. The article of manufacture of claim 10, in which the process further comprises:

identifying or receiving a pause instruction to pause the generation of the physical design;

pausing the generation of the physical design in response to the pause instruction;

identifying or receiving a resume instruction to resume paused generation of the physical design; and resuming the generation of the physical design in response to the resume instruction.

12. The article of manufacture of claim 10, in which the process further comprises:

identifying or receiving a rewind instruction to rewind the generation of the physical design to a prior time point or state; and restoring at least the physical design to a prior state corresponding to the prior time point or state in response to the rewind instruction.

13. The article of manufacture of claim 10, in which the process further comprises:

identifying or receiving a fast forward instruction to rewind the generation of the physical design to a later time point or state; and restoring at least the physical design to a later state corresponding to the later time point or state in response to the fast forward instruction.

14. The article of manufacture of claim 10, in which the process further comprises:

identifying or receiving an input for modifying the electronic design or the generation of the physical design during the generation of the physical design;

capturing the input for the generation of the physical design without exiting, terminating, or completing the generation of the physical design; and displaying an in-situ response of the physical design to the input during the generation of the physical design.

15. The article of manufacture of claim 10, in which the process further comprises:

displaying context-based response in the interface based at least in part upon a user's manipulation of the electronic design or of the interface, wherein the process displays an animated illustration of the physical design in substantially real-time in a normal order or in a reverse order.

16. The article of manufacture of claim 10, in which the process further comprises:

identifying or receiving a control instruction for manipulating one or more force models, a decomposition process, or conductivity information during the generation of the physical design; and displaying an in-situ response of the physical design to the control instruction during the generation of the physical design.

17. A system for providing evolving information in generating a physical design with custom conductivity using force models and design space decomposition, comprising:

a computing system that comprises at least one processor having at least one core and is to:

present a physical design area of an electronic design in an interface;

identify or receive an input for a physical design of the electronic design;

identify or receiving a request for creating the physical design of the electronic design; and display an evolution of the physical design in the interface to reflect temporal states of the physical design during generation of the physical design using the force models.

18. The system of claim 17, in which the computing system is further to:

identify or receive a pause instruction to pause the generation of the physical design;

pause the generation of the physical design in response to the pause instruction;

identify or receive a resume instruction to resume paused generation of the physical design; and resume the generation of the physical design in response to the resume instruction.

19. The system of claim 17, in which the computing system is further to:

identify or receive a rewind instruction to rewind the generation of the physical design to a prior time point or state; and restore at least the physical design to a prior state corresponding to the prior time point or state in response to the rewind instruction.

20. The system of claim 17, in which the computing system is further to:

identify or receive a fast forward instruction to rewind the generation of the physical design to a later time point or state; and restore at least the physical design to a later state corresponding to the later time point or state in response to the fast forward instruction.

21. The system of claim 17, in which the computing system is further to:

identify or receive an input for modifying the electronic design or the generation of the physical design during the generation of the physical design;

capture the input for the generation of the physical design without exiting, terminating, or completing the generation of the physical design; and display an in-situ response of the physical design to the input during the generation of the physical design.

22. The system of claim 17, in which the computing system is further to:

display context-based response in the interface based at least in part upon a user's manipulation of the electronic design or of the interface, wherein the process displays an animated illustration of the physical design in substantially real-time in a normal order or in a reverse order.

23. The system of claim 17, in which the computing system is further to:
  identify or receive a control instruction for manipulating one or more force models, a decomposition process, or conductivity information during the generation of the physical design; and
  display an in-situ response of the physical design to the control instruction during the generation of the physical design.

\* \* \* \* \*